(12) United States Patent
Lee et al.

(10) Patent No.: US 9,859,325 B2
(45) Date of Patent: Jan. 2, 2018

(54) COMPLEMENTARY METAL-OXIDE-SEMICONDUCTOR (CMOS) IMAGE SENSOR WITH SILICON AND SILICON GERMANIUM

(71) Applicant: Taiwan Semiconductor Manufacturing Co., Ltd., Hsin-Chu (TW)

(72) Inventors: Yueh-Chuan Lee, Hsinchu (TW); Chia-Chan Chen, Zhubei (TW); Jhy-Jyi Sze, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/143,690

(22) Filed: May 2, 2016

(65) Prior Publication Data

US 2017/0141153 A1 May 18, 2017

Related U.S. Application Data

(60) Provisional application No. 62/255,006, filed on Nov. 13, 2015.

(51) Int. Cl.
*H01L 29/06* (2006.01)
*H01L 27/146* (2006.01)

(52) U.S. Cl.
CPC .. *H01L 27/14652* (2013.01); *H01L 27/14616* (2013.01); *H01L 27/14638* (2013.01); *H01L 27/1463* (2013.01); *H01L 27/14689* (2013.01)

(58) Field of Classification Search
CPC ......... H01L 27/14652; H01L 27/14616; H01L 27/1463; H01L 27/1489; H01L 27/14638; H01L 27/14689
USPC .......................................................... 257/19
See application file for complete search history.

(56) References Cited

U.S. PATENT DOCUMENTS

| 2007/0001164 A1* | 1/2007 | Cha | H01L 27/14601 257/19 |
| 2009/0057735 A1* | 3/2009 | Beak | H01L 27/14603 257/292 |
| 2017/0062508 A1* | 3/2017 | Na | H01L 27/1443 |

* cited by examiner

*Primary Examiner* — Vongsavanh Sengdara
(74) *Attorney, Agent, or Firm* — Eschweiler & Potashnik, LLC

(57) ABSTRACT

A complementary metal-oxide-semiconductor (CMOS) image sensor with silicon and silicon germanium is provided. A silicon germanium layer abuts a silicon layer. A photodetector is arranged in the silicon germanium layer. A transistor is arranged on the silicon layer with a source/drain region that is buried in a surface of the silicon layer and that is electrically coupled to the photodetector. A method for manufacturing the CMOS image sensor is also provided.

20 Claims, 18 Drawing Sheets

COMPLEMENTARY METAL-OXIDE-SEMICONDUCTOR (CMOS) IMAGE SENSOR WITH SILICON AND SILICON GERMANIUM

REFERENCE TO RELATED APPLICATION

This Application claims the benefit of U.S. Provisional Application No. 62/255,006, filed on Nov. 13, 2015, the contents of which are incorporated herein by reference in their entirety.

BACKGROUND

Many modern day electronic devices comprise image sensors. Some types of image sensors include charge-coupled device (CCD) image sensors and complementary metal-oxide-semiconductor (CMOS) image sensors. Compared to CCD image sensors, CMOS image sensors are increasingly favored. CMOS image sensors provide lower power consumption, smaller size, and faster data processing than CCD image sensors. Further, CMOS image sensors provide a direct output of data that is not available in CCD image sensors. Even more, CMOS image sensors have a lower manufacturing cost compared to CCD image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
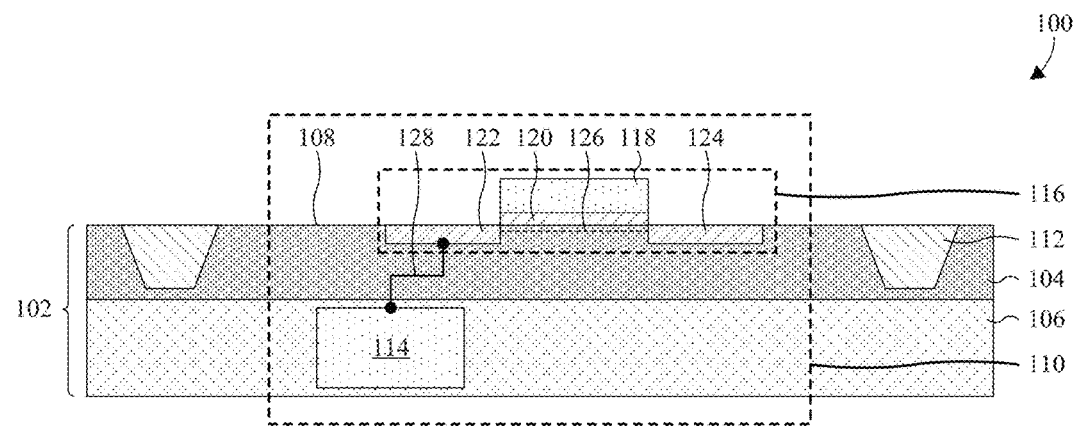
FIG. 1 illustrates a cross-sectional view of some embodiments of a complementary metal-oxide-semiconductor (CMOS) image sensor with silicon and silicon germanium.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide-semiconductor (CMOS) image sensors comprise a semiconductor layer of elemental silicon and an array of pixel sensors arranged in the semiconductor layer. The pixels sensors comprise respective photodetectors buried in the semiconductor layer and respective logic devices arranged on a surface of the semiconductor layer. A challenge with these CMOS image sensors is that the photodetectors have poor sensitivity to infrared radiation unless corrective measures are taken.

One solution is to extend the photodetectors deep into the semiconductor layer. However, this is difficult with existing CMOS processes and adds cost to the manufacture of the CMOS image sensors. Another solution is to use silicon germanium in place of elemental silicon for the semiconductor layer. Silicon germanium has a lower bandgap than elemental silicon, such that it is better for the absorption of infrared radiation. However, silicon germanium has poor compatibility with CMOS processes for the logic devices due to increased leakage current. As such, manufacturing the logic devices on silicon germanium introduces difficulties and adds cost to the manufacture of the CMOS image sensors.

The present application is directed to a CMOS image sensor with elemental silicon and silicon germanium for long-wavelength pixel sensors. In some embodiments, an elemental silicon layer abuts a silicon germanium layer. A photodetector is at least partially buried in the silicon germanium layer and a transistor is arranged on a surface of the elemental silicon layer with a source/drain region electrically coupled to the photodetector. By arranging the photodetector in the silicon germanium layer, the photodetector advantageously has good sensitivity to and absorption of long-wavelength radiation, such as, for example, infrared radiation. Further, by arranging the transistor on the elemental silicon layer, conventional CMOS processes may advantageously be used when forming the transistor.

With reference to FIG. 1, a cross-sectional view 100 of some embodiments of a CMOS image sensor with a semiconductor stack 102 of silicon and silicon germanium is provided. As illustrated, the semiconductor stack 102 comprises a silicon layer 104 and a silicon germanium layer 106. In some embodiments, the silicon germanium layer 106 partially covers an upper surface 108 of the silicon layer 104, and/or is buried in the upper surface 108 of the silicon layer 104. In other embodiments, the silicon germanium layer 106 is partially or fully covered by the silicon layer 104. The silicon and silicon germanium layers 104, 106 may correspond to epitaxial layers and/or regions of a semiconductor substrate, and the silicon layer 104 may be, for example, elemental silicon.

A pixel sensor 110 is arranged in the semiconductor stack 102, laterally surrounded by an isolation region 112 protruding into the semiconductor stack 102 from the upper surface 108 of the silicon layer 104. The pixel sensor 110 comprises a photodetector 114 at least partially buried in the silicon germanium layer 106, and one or more pixel transistors arranged on the upper surface 108 of the silicon layer 104. The photodetector 114 is, for example, a doped region of the semiconductor stack 102 having an opposite doping type as a bulk (e.g., majority) of the semiconductor stack 102. The pixel transistor(s) include, for example, a transfer transistor 116 configured to remove charge accumulated in the photodetector 114.

A transfer gate 118 of the transfer transistor 116 is arranged over the silicon layer 104, isolated from the silicon layer 104 by a transfer gate dielectric layer 120. Further, source/drain regions 122, 124 of the transfer transistor 116 are laterally spaced along the upper surface 108 of the silicon layer 104 to define a selectively-conductive channel region 126 under the transfer gate 118. The source/drain regions 122, 124 comprise a photodetector source/drain region 122 that is electrically coupled to the photodetector 114. In some embodiments, the photodetector source/drain region 122 extends to the photodetector 114, such that the photodetector source/drain region 122 is directly connected to the photodetector 114. In other embodiments, the photodetector source/drain region 122 is indirectly connected to the photodetector 114 along a conductive path 128.

Advantageously, by arranging the photodetector 114 in the silicon germanium layer 106, the photodetector 114 has good sensitivity to and absorption of long-wavelength radiation. Further, by arranging the pixel transistor(s), such as, for example, the transfer transistor 116, on the silicon layer 104, conventional CMOS processes may advantageously be used when forming the pixel transistor(s), thereby reducing costs.

While silicon germanium is used to accommodate the photodetector 114, other semiconductor materials may be used instead of silicon germanium. For example, another semiconductor material known to have advantageous properties regarding light collection may be used instead of silicon germanium.

Figure 2A:
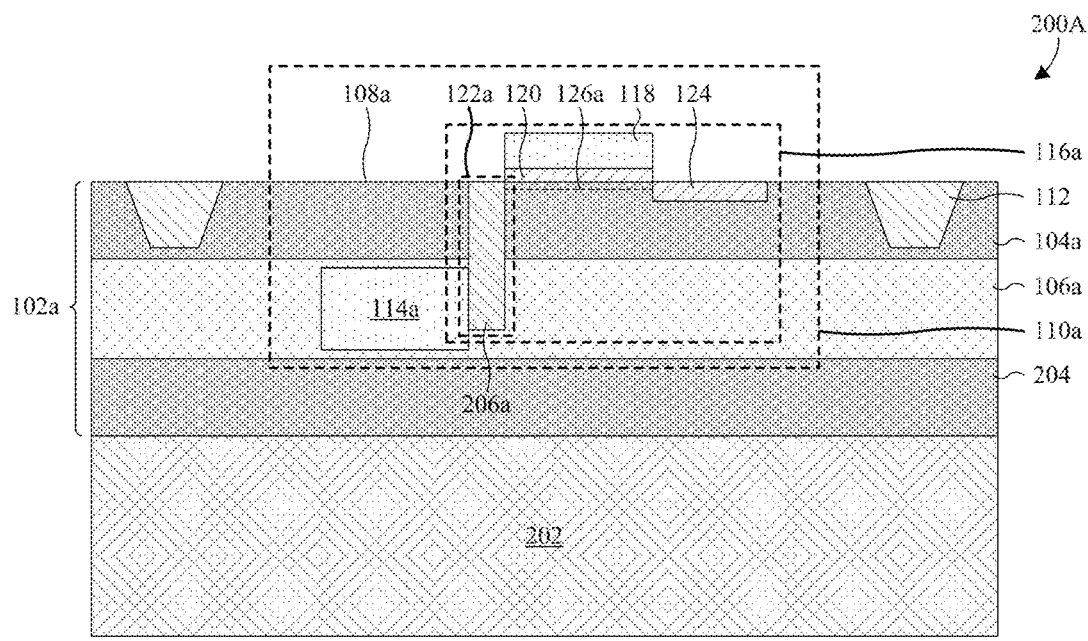
FIGS. 2A-2L illustrate cross-sectional views of more detailed embodiments of the CMOS image sensor of FIG. 1.

With reference to FIG. 2A, a cross-sectional view 200A of more detailed embodiments of the CMOS image sensor of FIG. 1 is provided. As illustrated, a semiconductor stack 102a is arranged over a semiconductor substrate 202, such as, for example, a bulk silicon substrate that is highly doped with p- or n-type dopants. The semiconductor stack 102a is doped with p- or n-type dopants, and comprises a pair of silicon layers 104a, 204 and a silicon germanium layer 106a arranged between the silicon layers 104a, 204. In some embodiments, the semiconductor stack 102a has a same doping type as the semiconductor substrate 202. Further, in some embodiments, a lower silicon layer 204 of the pair is arranged over and directly abuts the semiconductor substrate 202, the silicon germanium layer 106a is arranged over and directly abuts the lower silicon layer 204, and/or an upper silicon layer 104a of the pair is arranged over and directly abuts the silicon germanium layer 106a. The silicon layers 104a, 204 may be, for example, epitaxial layers of elemental or pure silicon, and the silicon germanium layer 106a may be, for example, an epitaxial layer of silicon germanium. In some embodiments, the amount of silicon x in the silicon germanium layer 106a is related to the amount of germanium y in the silicon germanium layer by y=1-x. For example, the silicon germanium layer 106a may be $Si_xGe_{1-x}$, where x is a value between 0 and 1. The amounts of silicon and germanium in the silicon germanium layer 106a may be, for example, quantified in terms of atoms or mass.

A pixel sensor 110a is arranged in the semiconductor stack 102a and may be, for example, an active pixel sensor. The pixel sensor 110a is laterally surrounded by an isolation region 112 protruding into the semiconductor stack 102a from an upper surface 108a of the upper silicon layer 104a. The isolation region 112 is, for example, a shallow trench isolation (STI) region, a deep trench isolation (DTI) region, or an implant isolation region. The pixel sensor 110a comprises a photodetector 114a buried in the silicon germanium layer 106a, and one or more pixel transistors arranged on the upper surface 108a of the upper silicon layer 104a. By arranging the photodetector 114a in the silicon germanium layer 106a, the photodetector 114a advantageously has good sensitivity to and absorption of long wavelength radiation. Long wavelength radiation includes, for example, infrared radiation with a wavelength between about 700 nanometers and about 1 millimeter.

The photodetector 114a is a doped region of silicon germanium with an opposite doping type as a surrounding region (e.g., a bulk) of the silicon germanium layer 106a to define a PN or PIN junction between the different doping types. For example, the photodetector 114a may be a region of the silicon germanium layer 106a with an opposite doping type as a bulk (e.g., majority) of the silicon germanium layer 106a. As another example, the photodetector 114a may be a layer of silicon germanium that has an opposite doping type as the silicon germanium layer 106a and that is independent of the semiconductor stack 102a.

The pixel transistor(s) include a transfer transistor 116a configured to remove charge accumulated in the photodetector 114a. The transfer transistor 116a comprises a transfer gate 118 arranged over the upper silicon layer 104a, isolated from the upper silicon layer 104a by a transfer gate dielectric layer 120. The transfer gate 118 may be, for example, doped polysilicon, metal, or some other conductive material. The transfer gate dielectric layer 120 may be, for example, an oxide, such as silicon dioxide, a high κ dielectric (i.e., a dielectric with a dielectric constant greater than about 3.9), or some other dielectric. The transfer gate 118 is arranged over a selectively-conductive channel region 126a. The selectively-conductive channel region 126a selectively conducts depending upon a bias applied to the transfer gate 118, and is defined between source/drain regions 122a, 124. The source/drain regions 122a, 124 are arranged in the upper surface 108a of the upper silicon layer 104a, on opposing sides of the transfer gate 118, and one of the source/drain regions 122a, 124 is or otherwise includes a conductive channel region 206a. The source/drain regions 122a, 124 may be, for example, doped regions of the upper silicon layer 104a having an opposite doping type as the semiconductor stack 102a.

The conductive channel region 206a extends from about even with the upper surface 108a of the upper silicon layer 104a to a location laterally adjacent to the photodetector 114a and laterally between the photodetector 114a and the transfer gate 118. In some embodiments, the conductive channel region 206a abuts a sidewall of the photodetector 114a. Further, since the conductive channel region 206a extends between the upper silicon layer 104a and the silicon germanium layer 106a, some embodiments of the conductive channel region 206a comprise a doping gradient with a higher concentration of dopants in the upper silicon layer 104a than in the silicon germanium layer 106a.

Figure 2B:
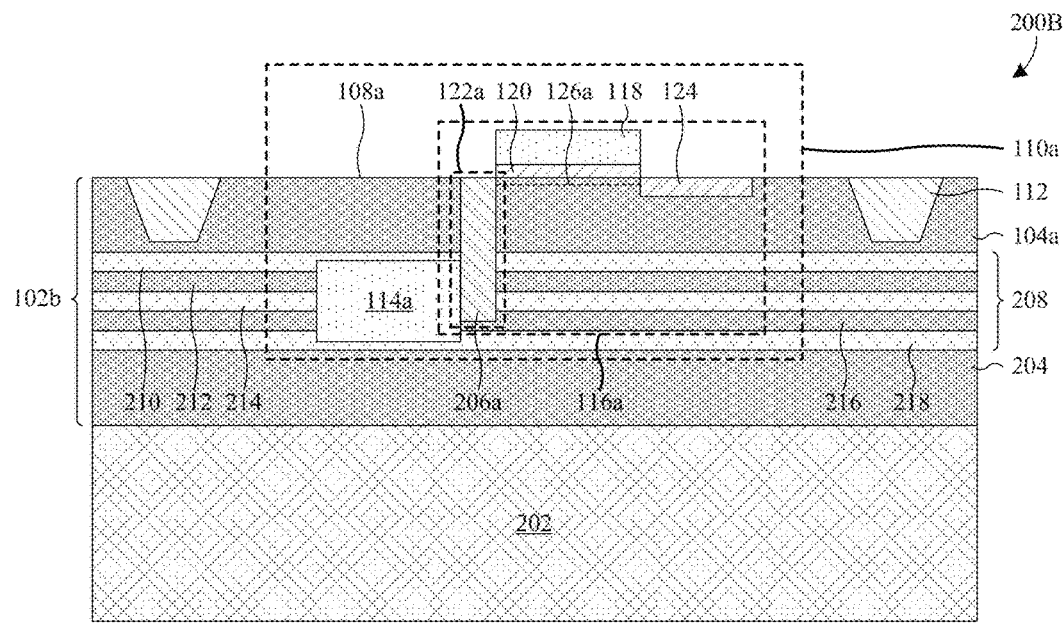

With reference to FIG. 2B, a cross-sectional view 200B of other more detailed embodiments of the CMOS image sensor of FIG. 1 is provided. As illustrated, a semiconductor stack 102b comprises a pair of silicon layers 104a, 204 and a second semiconductor stack 208 arranged between the silicon layers 104a, 204. The second semiconductor stack 208 comprises a plurality of layers 210, 212, 214, 216, 218 alternating between silicon and silicon germanium. For example, the second semiconductor stack 208 may comprise 3 silicon germanium layers 210, 214, 218 and 2 silicon layers 212, 216 between the 3 silicon germanium layers 210, 214, 218. In some embodiments, the layers 210, 212, 214, 216, 218 of the second semiconductor stack 208 are epitaxial layers. Further, in some embodiments, the silicon layers 212, 216 of the second semiconductor stack 208 are elemental or pure silicon, and/or the amount of silicon x in the silicon germanium layers 210, 214, 218 of the second semiconductor stack 208 is related to the amount of germanium y in the silicon germanium layers 210, 214, 218 by y=1−x. Even more, in some embodiments, thicknesses of the layers 210, 212, 214, 216, 218 in the second semiconductor stack 208 are optimized to facilitate total internal reflection of radiation entering the layers 210, 212, 214, 216, 218 so as to improve the sensitivity and/or quantum efficiency of a photodetector 114a arranged in the second semiconductor stack 208. For example, due to a difference between the indexes of refraction of the silicon germanium layers 210, 214, 218 and the silicon layers 212, 216, the silicon germanium layers 210, 214, 218 may act as light pipes to direct radiation towards the photodetector 114a.

The photodetector 114a comprises a stack of doped regions (not individually shown) alternating between silicon and silicon germanium to mimic the second semiconductor stack 208. Further, the doped regions have opposite doping types as bulks (e.g., majorities) of respective ones of the plurality of layers 210, 212, 214, 216, 218 in the second semiconductor stack 208 to define a PN or PIN junction between the different doping types. In some embodiments, the doped regions are regions of the respective ones of the plurality of layers 210, 212, 214, 216, 218 and have opposite doping types as bulks of the respective ones. In other embodiments, the doped regions are layers of silicon and silicon germanium that are same materials as the respective ones of the plurality of layers 210, 212, 214, 216, 218, that are independent of the semiconductor stack 102b, and that have opposite doping types as the respective ones.

Figure 2C:
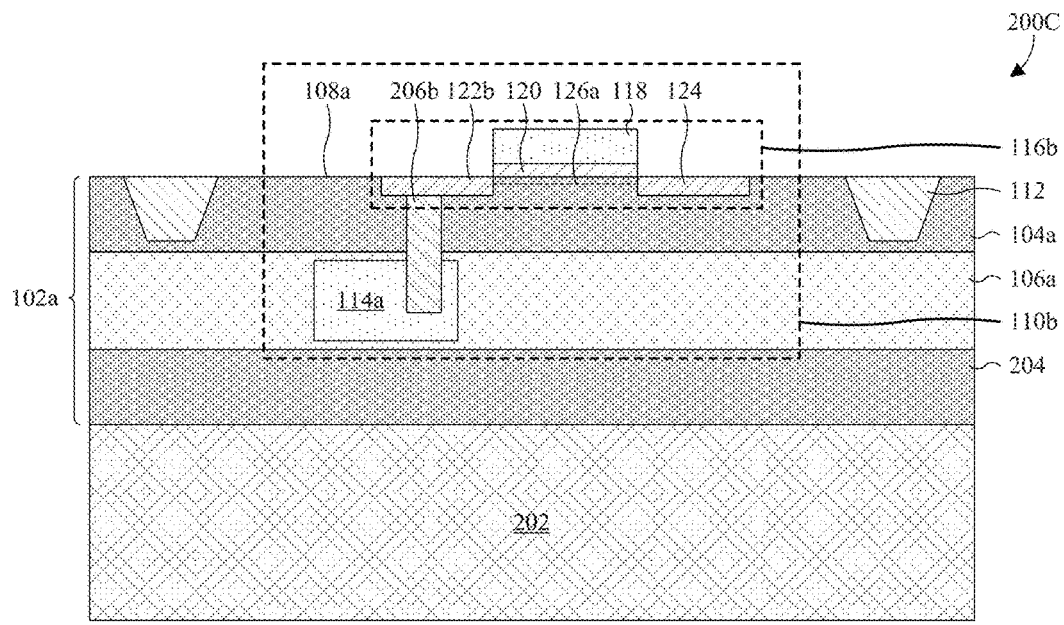

With reference to FIG. 2C, a cross-sectional view 200C of other more detailed embodiments of the CMOS image sensor of FIG. 1 is provided. As illustrated, a pixel sensor 110b comprises a transfer transistor 116b with a pair of source/drain regions 122b, 124 laterally spaced on opposing sides of a transfer gate 118. Further, a conductive channel region 206b extends vertically from one of the source/drain regions 122b, 124 to a location within a photodetector 114a underlying the one of the source/drain regions 122b, 124. The source/drain regions 122b, 124 and the conductive channel region 206b may be, for example, doped regions having an opposite doping type as a semiconductor stack 102a accommodating the pixel sensor 110b. Further, the conductive channel region 206b may have a doping gradient with a higher concentration of dopants in elemental silicon than in silicon germanium.

Figure 2D:
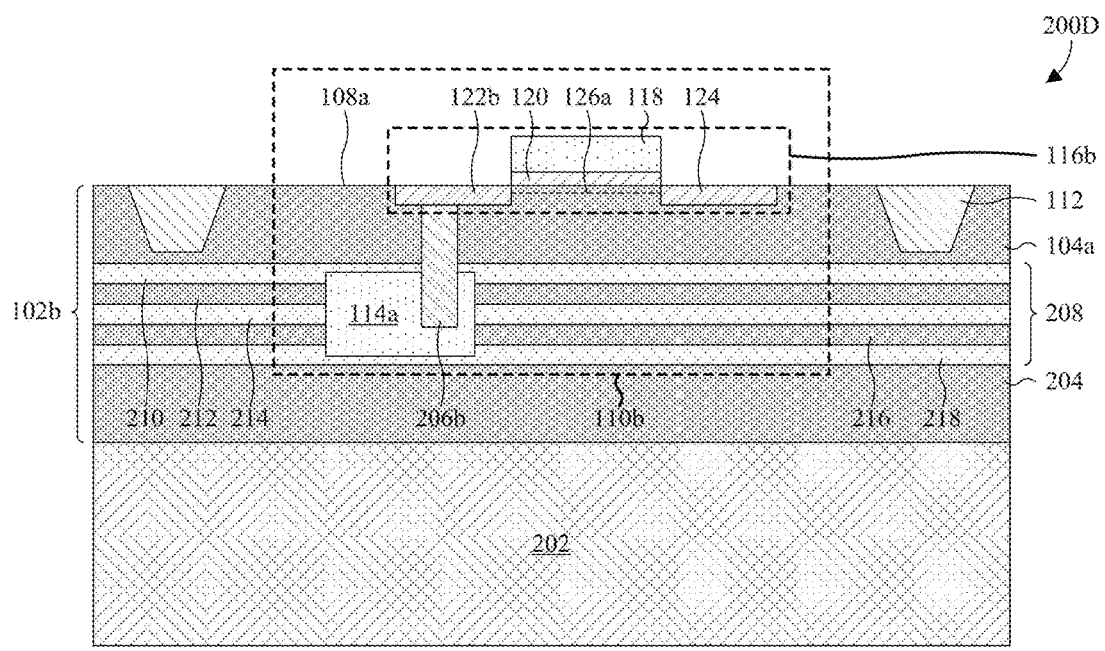

With reference to FIG. 2D, a cross-sectional view 200D of other more detailed embodiments of the CMOS image sensor of FIG. 1 is provided. As illustrated, FIG. 2D is a variant of FIG. 2C in which a second semiconductor stack 208 of silicon and silicon germanium replaces the silicon germanium layer 106a of FIG. 2C.

Figure 2E:
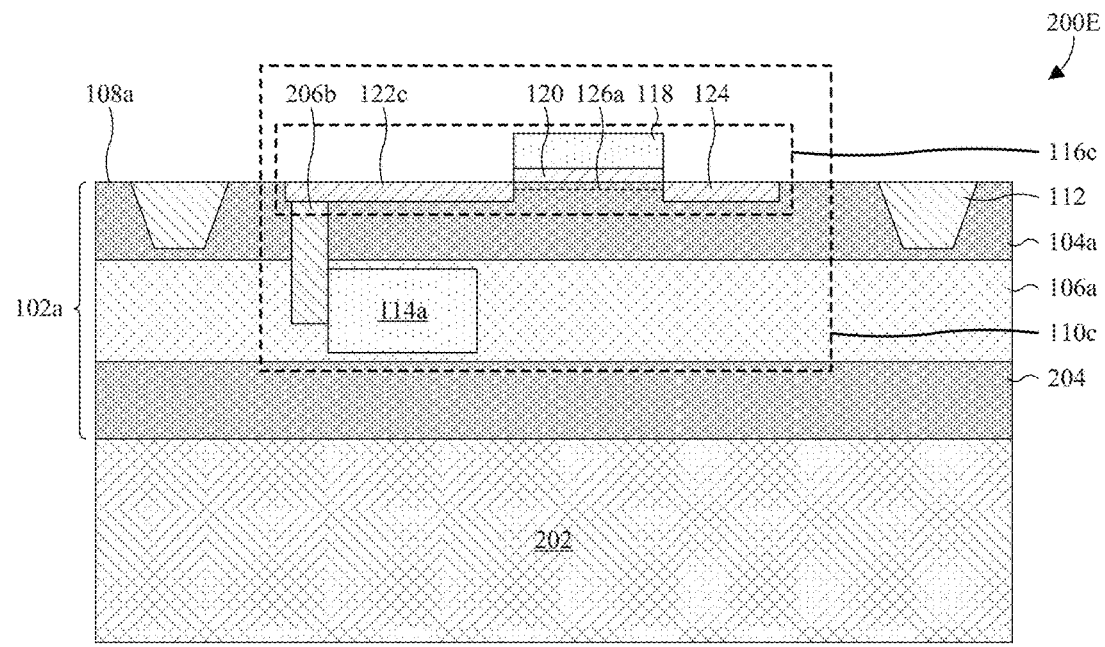

With reference to FIG. 2E, a cross-sectional view 200E of other more detailed embodiments of the CMOS image sensor of FIG. 1 is provided. As illustrated, a pixel sensor 110c comprises a transfer transistor 116c with a pair of source/drain regions 122c, 124 laterally spaced on opposing sides of a transfer gate 118. A transfer gate 118 of the transfer transistor 116c is arranged on a first side of a photodetector 114a underlying the transfer gate 118, and a conductive channel region 206b extends vertically from one of the source/drain regions 122c, 124 to a location laterally adjacent to a second side of the photodetector 114a that is opposite the first side. In some embodiments, the conductive channel region 206b abuts a sidewall of the photodetector 114a that is on the second side. The source/drain regions 122c, 124 and the conductive channel region 206b may be, for example, doped regions having an opposite doping type as a semiconductor stack 102a accommodating the pixel sensor 110c.

Figure 2F:
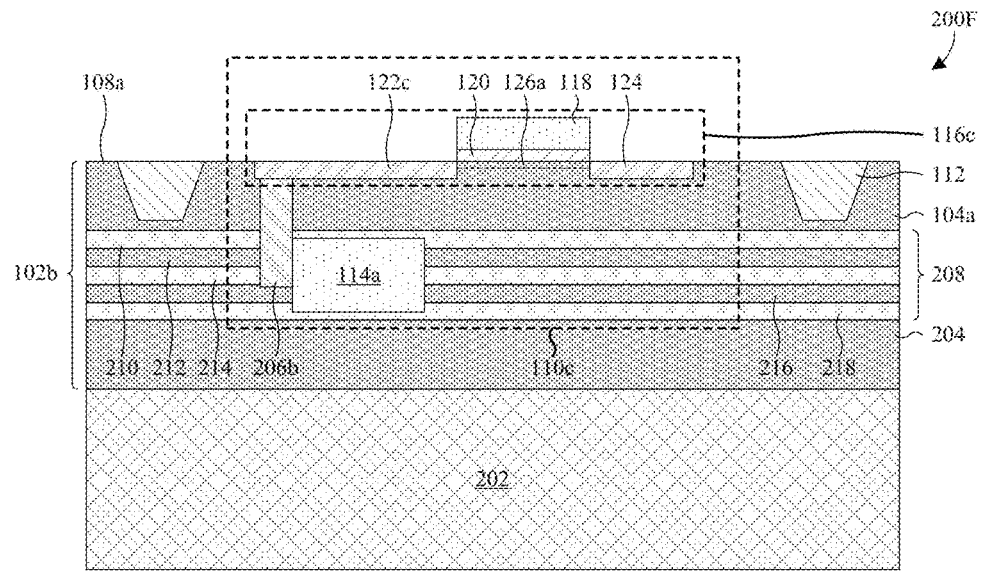

With reference to FIG. 2F, a cross-sectional view 200F of other more detailed embodiments of the CMOS image sensor of FIG. 1 is provided. As illustrated, FIG. 2F is a variant of FIG. 2E in which a second semiconductor stack 208 of silicon and silicon germanium replaces a silicon germanium layer 106a of FIG. 2E.

Figure 2G:
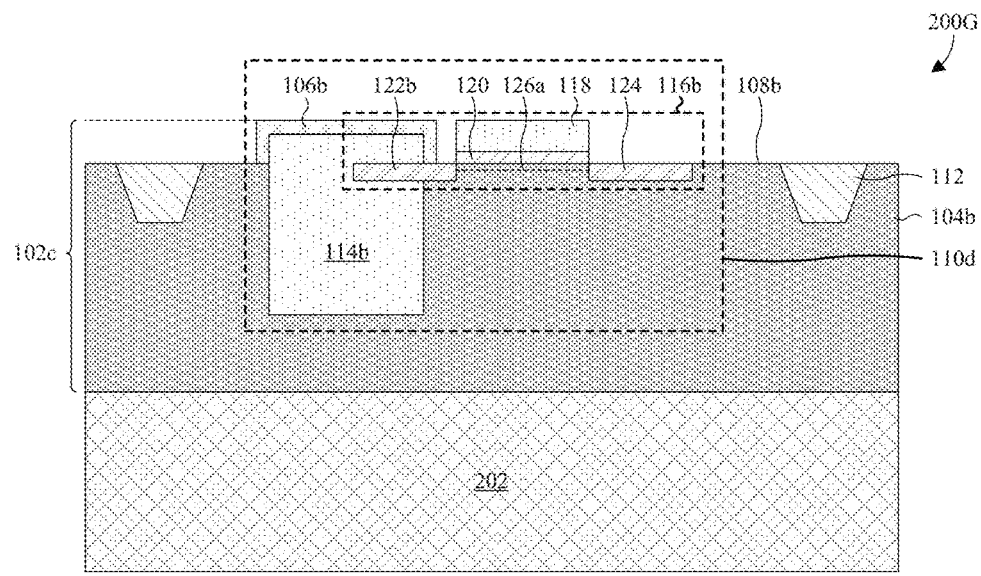

With reference to FIG. 2G, a cross-sectional view 200G of other more detailed embodiments of the CMOS image sensor of FIG. 1 is provided. As illustrated, a semiconductor stack 102c supports a pixel sensor 110d, and comprises a silicon layer 104b and a silicon germanium layer 106b partially covering the silicon layer 104b. In some embodiments, the semiconductor stack 102c is doped and/or shares a doping type with a semiconductor substrate 202 underlying the semiconductor stack 102c. Further, in some embodiments, the silicon germanium layer 106b directly abuts the silicon layer 104b, and/or the silicon layer 104b directly abuts the semiconductor substrate 202. The silicon layer 104b may be, for example, an epitaxial layer of elemental or pure silicon, and the silicon germanium layer 106b may be, for example, an epitaxial layer of silicon germanium. In some embodiments, the amount of silicon x in the silicon germanium layer 106b is related to the amount of germanium y in the silicon germanium layer by y=1−x. Further, in some embodiments, the silicon germanium layer 106b has a thickness of about 10 nanometers or about 100 nanometers. The pixel sensor 110d comprises a photodetector 114b buried in both the silicon layer 104b and the silicon germanium layer 106b, and one or more pixel transistors arranged on the silicon layer 104b.

The photodetector 114b comprises a stack of doped regions (not individually shown) alternating between silicon and silicon germanium to mimic semiconductor stack 102c. Further, the doped regions have opposite doping types as bulks (e.g., majorities) of respective ones of the silicon layer 104b and the silicon germanium layer 106b to define a PN or PIN junction between the different doping types. In some embodiments, the doped regions are regions of the respective ones of the silicon layer 104b and the silicon germanium layer 106b and have opposite doping types as bulks of the respective ones. In other embodiments, the doped regions are layers of silicon and silicon germanium that are same materials as the respective ones of the silicon layer 104b and the silicon germanium layer 106b, that are independent of the semiconductor stack 102c, and that have opposite doping types as the respective ones.

The pixel transistor(s) include a transfer transistor 116b configured to remove charge accumulated in the photodetector 114b. The transfer transistor 116b comprises a transfer gate 118 arranged over the silicon layer 104b. The transfer gate 118 is arranged laterally adjacent to and spaced from the silicon germanium layer 106b, and is isolated from the silicon layer 104b by a transfer gate dielectric layer 120. Source/drain regions 122b, 124 are arranged in the silicon layer 104b on opposite sides of the transfer gate 118. The source/drain regions 122b, 124 may be, for example, doped regions of the silicon layer 104b and/or the silicon germanium layer 106b having an opposite doping type (e.g., p- or n-type) as the semiconductor stack 102c. In some embodiments, one of the source/drain regions 122b, 124 protrudes into the photodetector 114 and/or abuts the silicon germanium layer 106b.

Figure 2H:
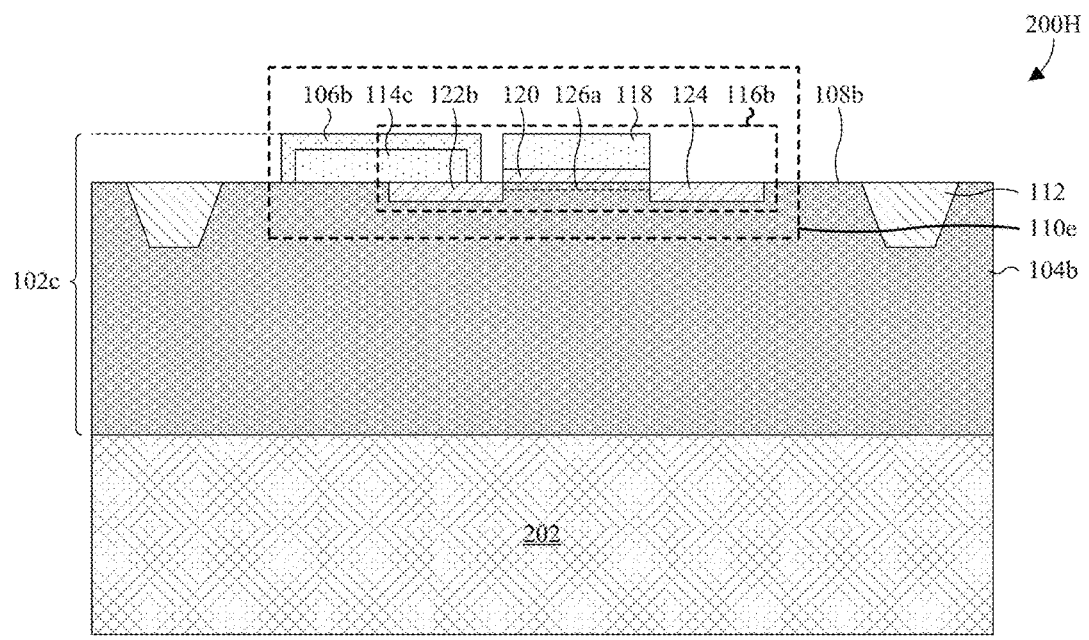

With reference to FIG. 2H, a cross-sectional view 200H of other more detailed embodiments of the CMOS image sensor of FIG. 1 is provided. As illustrated a pixel sensor 110e comprises a photodetector 114c confined to a silicon germanium layer 106b that partially covers a silicon layer 104b. The photodetector 114c is a doped region of silicon germanium with an opposite doping type as a surrounding region (e.g., a bulk) of the silicon germanium layer 106b to define a PN or PIN junction between the different doping types. For example, the photodetector 114c may be a region of the silicon germanium layer 106b with an opposite doping type as a bulk (e.g., majority) of the silicon germanium layer 106b. As another example, the photodetector 114c may be a layer of silicon germanium that has an opposite doping type as the silicon germanium layer 106b and that is independent of the semiconductor stack 102c. In some embodiments, the photodetector 114c is laterally adjacent to a transfer gate 118 of a transfer transistor 116b. Further, in some embodiments, the photodetector 114c partially covers and/or abuts a source/drain region 122b of the transfer transistor 116b.

Figure 2I:
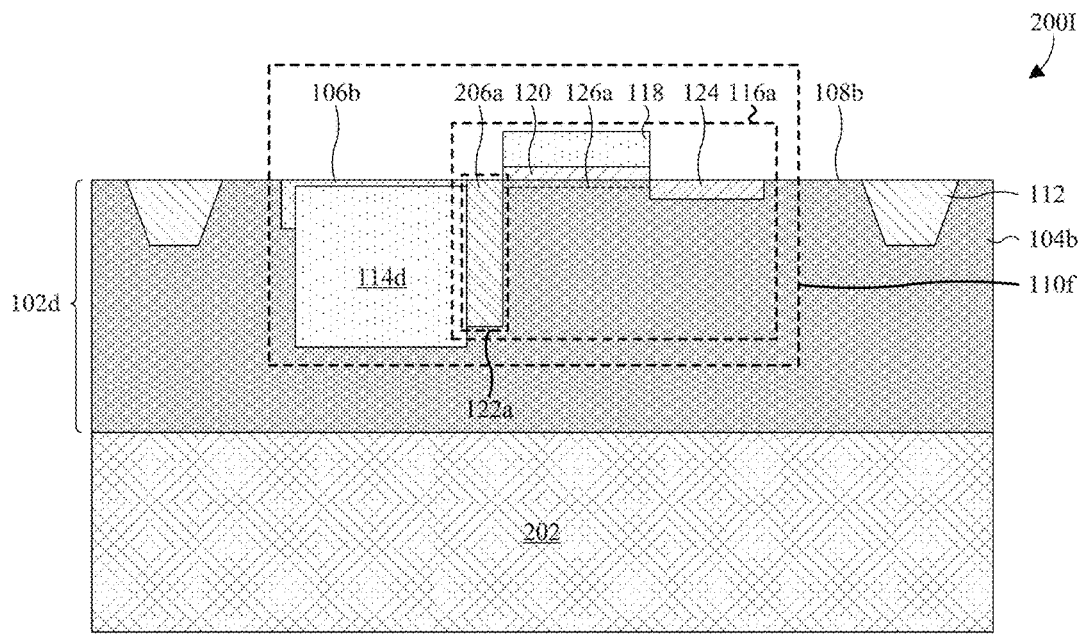

With reference to FIG. 2I, a cross-sectional view 200I of other more detailed embodiments of the CMOS image sensor of FIG. 1 is provided. As illustrated, a semiconductor stack 102d supports a pixel sensor 110f, and comprises a silicon layer 104b and a silicon germanium layer 106b buried in an upper surface 108b of the silicon layer 104b. In some embodiments, the semiconductor stack 102d is doped and/or shares a doping type with a semiconductor substrate 202 underlying the semiconductor stack 102d. The pixel sensor 110f comprises a photodetector 114d buried in both the silicon layer 104b and the silicon germanium layer 106b, and one or more pixel transistors arranged on the silicon layer 104b.

The photodetector 114d comprises a stack of doped regions (not individually shown) alternating between silicon and silicon germanium to mimic semiconductor stack 102d. Further, the doped regions have opposite doping types as bulks (e.g., majorities) of respective ones of the silicon layer 104b and the silicon germanium layer 106b to define a PN or PIN junction between the different doping types. In some embodiments, the doped regions are regions of the respective ones of the silicon layer 104b and the silicon germanium layer 106b, and have opposite doping types as bulks of the respective ones.

The pixel transistor(s) comprise a transfer transistor 116a. Source/drain regions 122a, 124 of the transfer transistor 116a are arranged in the upper surface 108b of the silicon layer 104b, on opposing sides of a transfer gate 118 of the transfer transistor 116a, and one of the source/drain regions 122a, 124 is or otherwise includes a conductive channel region 206a. The conductive channel region 206a extends from about even with the upper surface 108b of the silicon layer 104b to a location laterally adjacent to the photodetector 114d and laterally between the photodetector 114d and the transfer gate 118. In some embodiments, the conductive channel region 206a abuts a sidewall of the photodetector 114d. Further, in some embodiments, the conductive channel region 206a is arranged in the silicon germanium layer 106b and/or abuts the silicon germanium layer 106b.

Figure 2J:
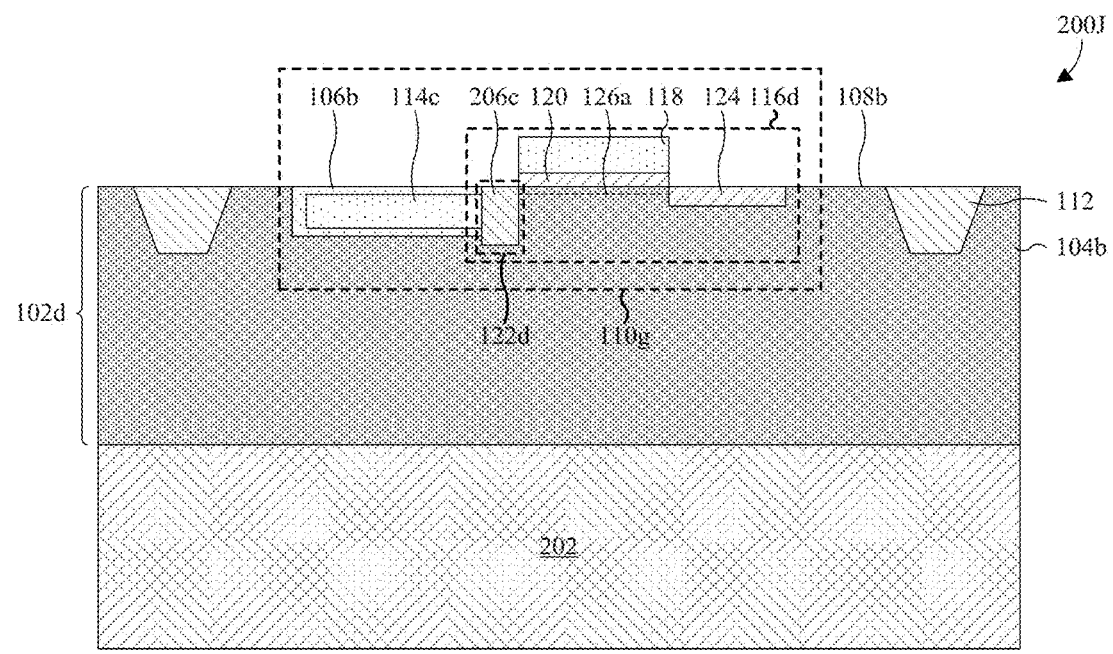

With reference to FIG. 2J, a cross-sectional view 200J of other more detailed embodiments of the CMOS image sensor of FIG. 1 is provided. As illustrated a pixel sensor 110g comprises a photodetector 114c confined to a silicon germanium layer 106b that is buried in an upper surface 108b of a silicon layer 104b. In some embodiments, the photodetector 114c abuts a source/drain region 122d of a transfer transistor 116d that is arranged laterally adjacent to the silicon germanium layer 106b.

The source/drain region 122d is arranged in the upper surface 108b of the silicon layer 104b and may be, for example, a doped region of the silicon layer 104b having an opposite doping type as a bulk of the silicon layer 104b. The source/drain region 122d comprises a conductive channel region 206c extending from about even with the upper surface 108b of the silicon layer 104b to a location laterally adjacent to the photodetector 114c and laterally between the photodetector 114c and a transfer gate 118 of the transfer transistor. In some embodiments, the conductive channel region 206c is arranged in the silicon germanium layer 106b and comprises a doping gradient with a higher concentration of dopants in the silicon layer 104b than in the silicon germanium layer 106b. Further, in some embodiments, the conductive channel region 206c abuts a sidewall of the photodetector 114c.

Figure 2K:
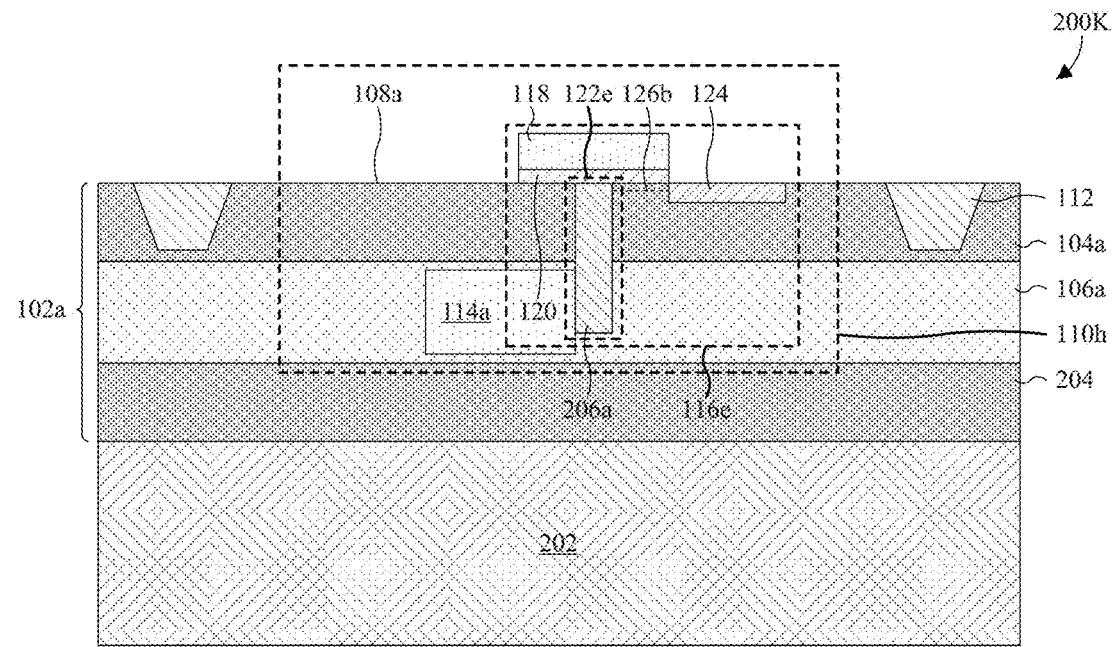

With reference to FIG. 2K, a cross-sectional view 200K of other more detailed embodiments of the CMOS image sensor of FIG. 1 is provided. As illustrated, a pixel sensor 110h comprises a transfer transistor 116e with a pair of source/drain regions 122e, 124. The source/drain regions 122e, 124 are laterally spaced to define a selectively-conductive channel region 126b under a transfer gate 118 of the transfer transistor 116e. Further, one of the source/drain regions 122e, 124 is arranged under the transfer gate 118 and is or otherwise includes a conductive channel region 206a. The conductive channel region 206a extends vertically from about even with an upper surface 108a of a silicon layer 104a supporting the transfer transistor 116e to a location laterally adjacent to a photodetector 114a underlying the transfer gate 118. In some embodiments, the conductive channel region 206a abuts a sidewall of the photodetector 114a.

Figure 2L:
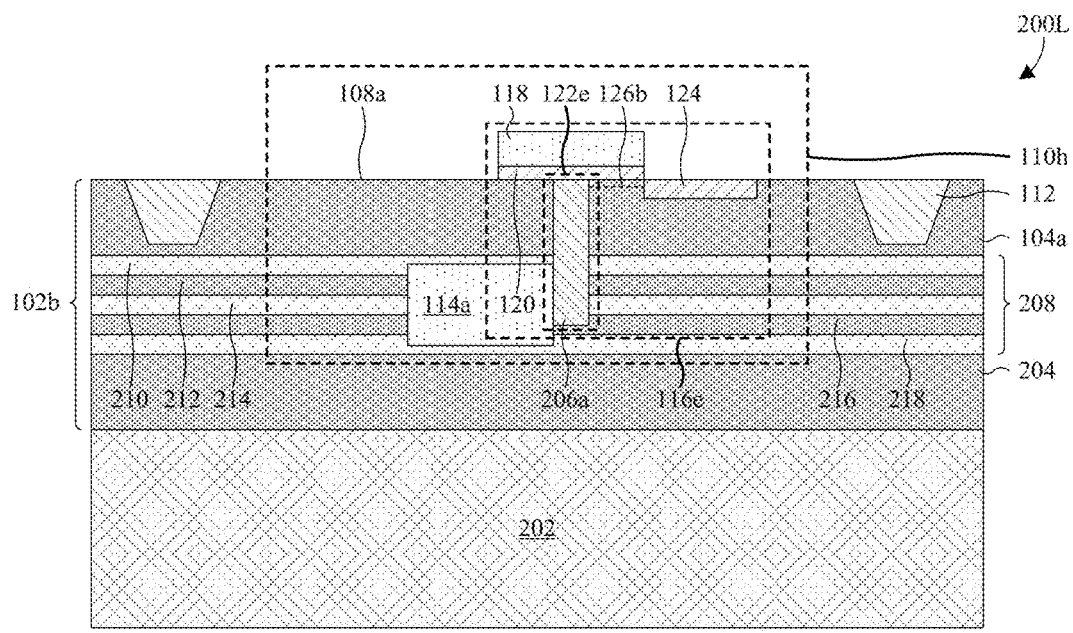

With reference to FIG. 2L, a cross-sectional view 200L of other more detailed embodiments of the CMOS image sensor of FIG. 1 is provided. As illustrated, FIG. 2L is a variant of FIG. 2K in which a second semiconductor stack 208 of silicon and silicon germanium replaces a silicon germanium layer 106a of FIG. 2K.

While the semiconductor stacks 102a-d of FIGS. 2A-2L are illustrated as being arranged over a semiconductor substrate 202, it is to be appreciated that the semiconductor stacks 102a-d may be fully or partially arranged in the semiconductor substrate 202 in other embodiments. For example, a lower silicon layer 204 of FIG. 2A may be a doped region of the semiconductor substrate 202.

Figure 3A:
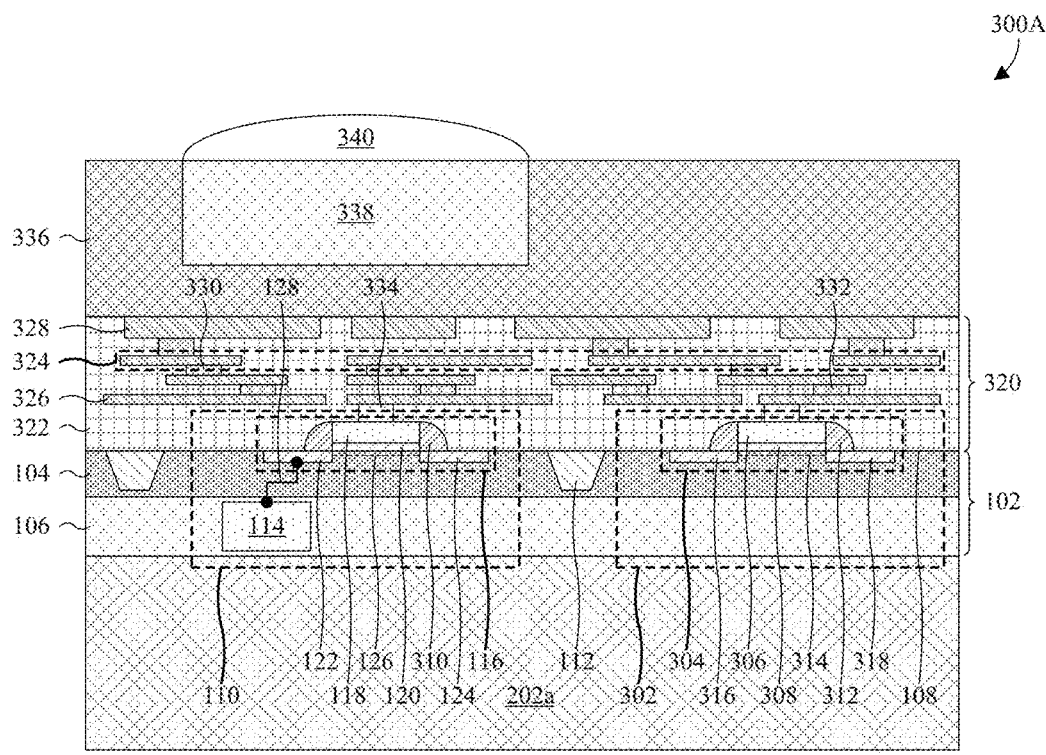
FIGS. 3A and 3B illustrate cross-sectional views respectively of some frontside illuminated (FSI) and backside illuminated (BSI) embodiments of the CMOS image sensor of FIG. 1.

With reference to FIG. 3A, a cross-sectional view 300A of some frontside illuminated (FSI) embodiments of the CMOS image sensor of FIG. 1 is provided. FIG. 3A is illustrated with the semiconductor structure of FIG. 1, but it is to be appreciated that the semiconductor structure of FIG. 1 may be replaced with a semiconductor structure of FIGS. 2A-L. As illustrated, a semiconductor stack 102 is arranged over a semiconductor substrate 202a, such as, for example, a bulk silicon substrate that is highly doped with p- or n-type dopants. The semiconductor stack 102 is doped with p- or n-type dopants, and comprises a silicon layer 104 and a silicon germanium layer 106. In some embodiments, the semiconductor stack 102 has a same doping type as the semiconductor substrate 202a. Further, in some embodiments, the silicon layer 104 and the silicon germanium layer 106 directly abut. The silicon layer 104 may be, for example, an epitaxial layer of elemental or pure silicon, and the silicon germanium layer 106 may be, for example, an epitaxial layer of silicon germanium. In some embodiments, the amount of silicon x in the silicon germanium layer 106 is related to the amount of germanium y in the silicon germanium layer 106 by y=1−x.

A pixel sensor 110 and a logic region 302 are arranged in the semiconductor stack 102. The pixel sensor 110 may be, for example, an active pixel sensor, and is laterally surrounded by an isolation region 112 protruding into the semiconductor stack 102 from an upper surface 108 of the silicon layer 104. The isolation region 112 is, for example, a STI region or a DTI region. The pixel sensor 110 comprises a photodetector 114 buried in the silicon germanium layer 106, and one or more pixel transistors arranged on the silicon layer 104. The pixel transistor(s) include a transfer transistor 116 configured to transfer charge accumulated in the photodetector 114 out of the photodetector 114. The logic region 302 is arranged laterally adjacent to the pixel sensor 110 and the isolation region 112, and comprises one or more logic transistors configured to read and/or store data generated by the pixel sensor 110.

The photodetector 114 is a doped region with an opposite doping type as a surrounding region (e.g., a bulk) of the semiconductor stack 102 to define a PN or PIN junction between the different doping types. For example, a bulk of the one or more layers of the semiconductor stack 102 that accommodate the photodetector 114 may have a first doping type (e.g., p-type doping) and the photodetector 114 may have a second, opposite doping type (e.g., n-type doping) as the bulk. The photodetector 114 comprises one or more doped regions (not individually shown) of silicon and/or silicon germanium that are stacked to mimic the accommodating layer(s) of the semiconductor stack 102. In some embodiments, the doped region(s) of the photodetector 114 are region(s) of respective ones of the accommodating layer(s) and have opposite doping types as bulk(s) of the respective ones of the accommodating layer(s). In other embodiments, the doped region(s) of the photodetector 114 are layer(s) that are a same material as the respective ones of the accommodating layer(s), that are independent of the semiconductor stack 102, and that have opposite doping types as the respective ones of the accommodating layer(s). For example, supposing the photodetector 104 is distributed between first and second layers of the semiconductor stack 102 that have different materials, the photodetector 104 may comprise a pair of layers (or regions) that correspond to the different materials, that are stacked to mimic the first and second layers, and that have opposite doping types as bulks of respective ones of the first and second layers.

The transfer transistor 116 and a logic transistor 304 of the logic region 302 comprise respective gates 118, 306 arranged over the silicon layer 104, isolated from the silicon layer 104 by respective gate dielectric layer 120, 308. The gates 118, 306 may be, for example, doped polysilicon, metal, or some other conductive material. The gate dielectric layers 120, 308 may be, for example, an oxide, such as silicon dioxide, a high κ dielectric, or some other dielectric. The gates 118, 306 comprise sidewalls lined by respective spacers 310, 312 and are arranged over respective selectively-conductive channel regions 126, 314. The spacers 310, 312 may be, for example, silicon nitride, silicon dioxide, or some other dielectric. The selectively-conductive channel regions 126, 314 selectively conduct depending upon a bias applied to respective gates 118, 306, and are defined between respective source/drain regions 122, 124, 316, 318 arranged in the upper surface 108 of the silicon layer 104, on opposing sides of the respective gates 118, 306. The source/drain regions 122, 124, 316, 318 may be, for example, doped regions of the silicon layer 104 having an opposite doping type (e.g., p- or n-type) as the semiconductor stack 102. Further, one of the source/drain regions 122, 124 of the transfer transistor 116 is electrically coupled to the photodetector 114 either directly or indirectly along a conductive path 128.

An interconnect structure 320 is arranged over the semiconductor stack 102 and the pixel and logic transistors, such as, for example, the transfer transistor 116. The interconnect structure 320 interconnects the pixel and logic transistors, and comprises an inter-layer dielectric (ILD) region 322 within which multiple layers 324 of conductive features 326, 328 are arranged. For ease of illustration, only one of the multiple layers 324 is labeled, and only some of the conductive features 326, 328 are labeled. The ILD region 322 may comprise, for example, a stack of ILD layers (not individually shown). The ILD region 322 may be or otherwise include, for example, an oxide, a low κ dielectric (i.e., a dielectric with a dielectric constant less than about 3.9), or some other dielectric material. The layers 324 of conductive features 326, 328 are stacked in the ILD region 322, and the conductive features 326, 328 may be, for example, lines and pads. The layers 324 of conductive features 326, 328 are interconnected by vias 330, 332 arranged between the layers 324, and are connected to the pixel and logic transistors by contacts 334 arranged between a bottom one of the layers 324 and the pixel and logic transistors. For ease of illustrate, only some of the vias 330, 332 and one of the contacts 334 are labeled. The layers 324 of conductive features 326, 328, the vias 330, 332, and the contacts 334 may be, for example, a metal, such as copper or tungsten, or some other conductive material.

A passivation layer 336 is arranged over the ILD region 322, and comprises a well filled with a color filter 338 and covered by a microlens 340. The passivation layer 336 may be, for example, a multilayer stack of dielectric layers, such as, for example, a nitride layer stacked between a pair of oxide layers. The color filter 338 is configured to selectively transmit an assigned color or wavelengths of radiation (e.g., light) to the pixel sensor 110, and the microlens 340 is configured to focus incident radiation onto the color filter 338 and/or the pixel sensor 110. In some embodiments, the color filter 338 is configured to transmit infrared radiation, while blocking other wavelengths of radiation.

Figure 3B:
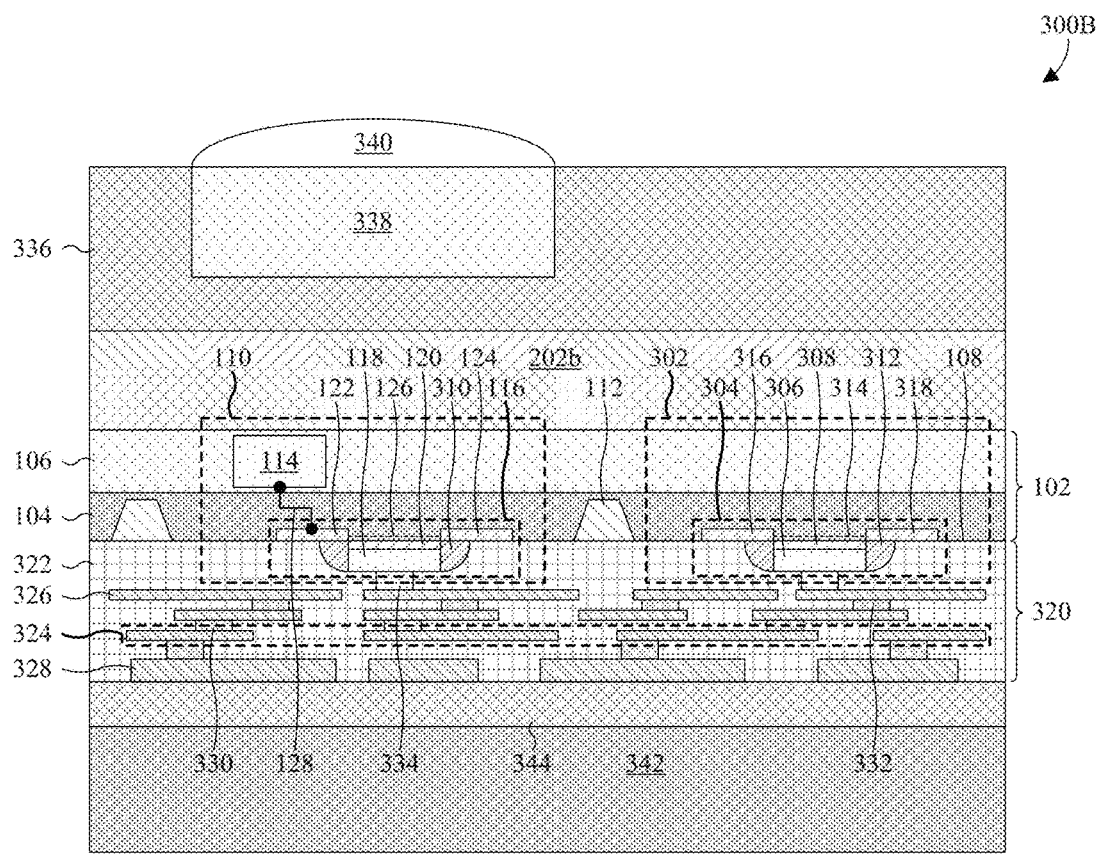

With reference to FIG. 3B, a cross-sectional view 300B of some backside illuminated (BSI) embodiments of the CMOS image sensor of FIG. 1 is provided. FIG. 3B is illustrated with the semiconductor structure of FIG. 1, but it is to be appreciated that the semiconductor structure of FIG. 1 may be replaced with a semiconductor structure of FIGS. 2A-2L. As illustrated, a support device 342 supports an interconnect structure 320 through a first passivation layer 344. The first passivation layer 344 may be, for example, a dielectric material, such as silicon nitride, and the support device 342 may be, for example, an integrated circuit or a bulk semiconductor substrate. A semiconductor stack 102 is arranged over the interconnect structure 320 and a semiconductor substrate 202b is arranged over the semiconductor stack 102. Further, a second passivation layer 336 is arranged over the semiconductor substrate 202 and comprises a well overlying a pixel sensor 110 in the semiconductor stack 102. The well is filled with a color filter 338 and covered by a microlens 340

Figure 4:
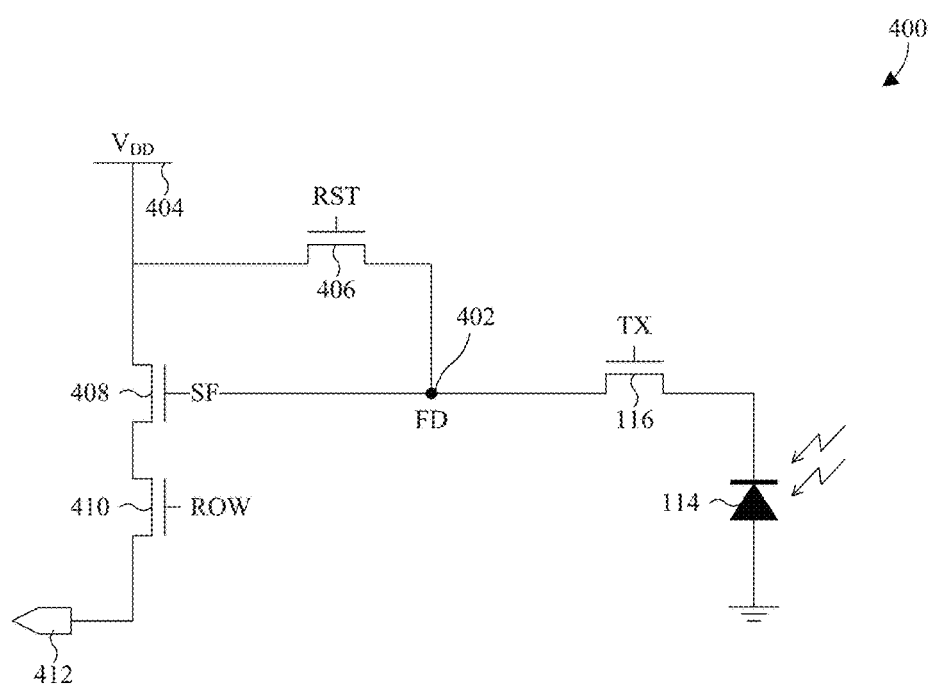
FIG. 4 illustrates a circuit diagram of some embodiments of a pixel sensor in the CMOS image sensor of FIG. 1.

With reference to FIG. 4, a circuit diagram 400 of some embodiments of the pixel sensor 110 of FIG. 1 is provided. As illustrated, a charge storage node 402 (e.g., a floating diffusion (FD) node) is selectively coupled to a photodetector 114 by a transfer transistor 116, and is selectively coupled to a power source 404 by a reset transistor 406. The photodetector 114 may be, for example, a photodiode, and/or the power source 404 may be, for example, a direct current (DC) power source. The transfer transistor 116 is configured to selectively transfer charge accumulated in the photodetector 114 to the charge storage node 402, and the reset transistor 406 is configured to selectively clear charge stored at the charge storage node 402. The charge storage node 402 gates a source follower transistor 408 to selectively couple the power source 404 to a row select transistor 410, and the row select transistor 410 selectively couples the source follower transistor 408 to an output 412. The source follow transistor 408 is configured to non-destructively read and amplify charge stored in the charge storage node 402, and the row select transistor 410 is configured to select the pixel sensor 110 for readout.

While the pixel sensor 110 of FIG. 1 is described as a five transistor (5T) active pixel sensor (i.e., an active pixel sensor with 5 transistors) within FIG. 4, it is to be appreciated that other embodiments of the pixel sensor 110 may include more or less transistors. For example, other embodiments of the pixel sensor 110 of FIG. 1 may include 2, 3, or 6 transistors.

Figure 5:
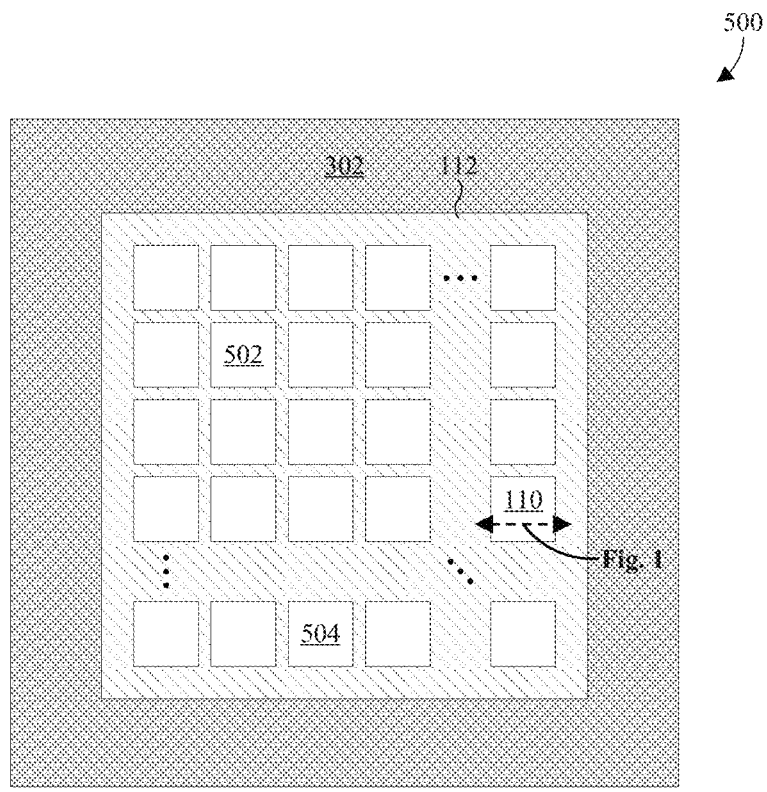
FIG. 5 illustrates a top view of some embodiments of the CMOS image sensor of FIG. 1.

With reference to FIG. 5, a top view 500 of some embodiments of the CMOS image sensor of FIG. 1 is provided. As illustrated, a logic region 302 of the CMOS image sensor laterally surrounds an isolation region 112 within which an array of pixel sensors 110, 502, 504 (only some of which are labeled) are arranged. The logic region 302 comprises, for example, logic and/or memory devices (not shown) configured to read and/or store data generated by the pixel sensors 110, 502, 504 in response to incident radiation. The isolation region 112 is configured to isolate the pixel sensors 110, 502, 504 and is, for example, a STI or DTI region. The pixel sensors 110, 502, 504 are individually configured according to the pixel sensor 110 of FIG. 1, FIGS. 2A-2L, or FIG. 3A or 3B, and are arranged in rows and columns.

With reference to FIGS. 6-12, a series of cross-sectional views of some embodiments of a method for manufacturing a CMOS image sensor with silicon and silicon germanium is provided. The cross-sectional views may, for example, correspond to the CMOS image sensor of FIG. 2A at various stages of manufacture.

Figure 6:
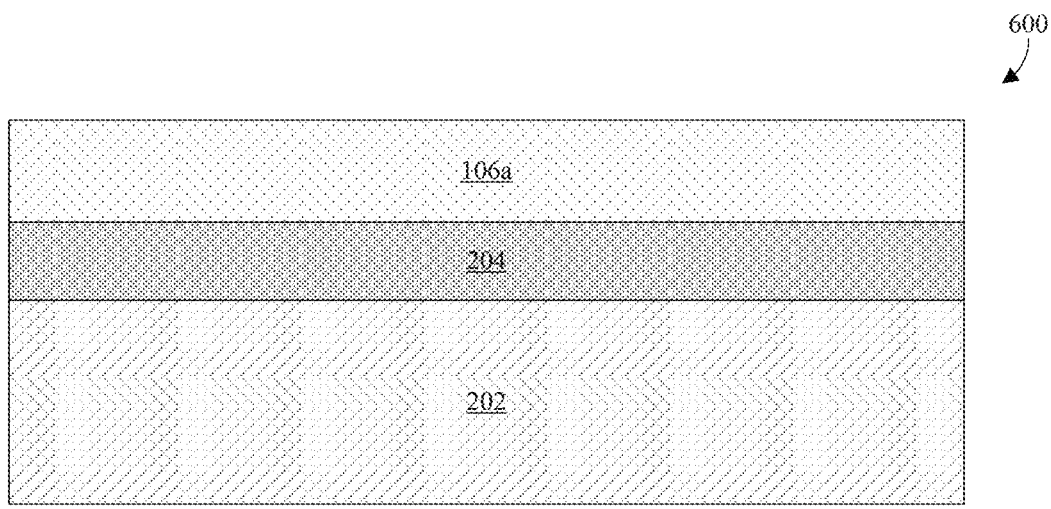
FIGS. 6-12 illustrate a series of cross-sectional views of some embodiments of a method for manufacturing a CMOS image sensor with silicon and silicon germanium.

As illustrated by the cross-sectional view 600 of FIG. 6, a lower silicon layer 204 and a silicon germanium layer 106a are formed stacked upon one another by epitaxy. The lower silicon layer 204 is formed on a semiconductor substrate 202 and a silicon germanium layer 106a is formed on the lower silicon layer 204. In some embodiments, the lower silicon layer 204 is formed of elemental or pure silicon, and/or is formed directly on the semiconductor substrate 202. Further, in some embodiments, the silicon germanium layer 106a is formed of $SiGe_{1-x}$, and/or is formed directly on the lower silicon layer 204. The semiconductor substrate 202 may be, for example, a bulk semiconductor substrate, such as a bulk silicon substrate, or a silicon-on-insulator (SOI) substrate, and/or may be, for example, doped with p- or n-type dopants.

In alternative embodiments, a plurality of layers may alternatingly be formed of silicon and silicon germanium in place of the silicon germanium layer 106a. In some of such embodiments, these plurality of layers may have individual thicknesses less than a thickness of the lower silicon layer 204, and/or a combined thickness approximately equal to or greater than the thickness of the lower silicon layer 204. Further, in some embodiments, the plurality of layers may be formed as described with regards to the second semiconductor stack 208 in, for example, FIG. 2B, 2D, 2F, or 2L.

Figure 7:
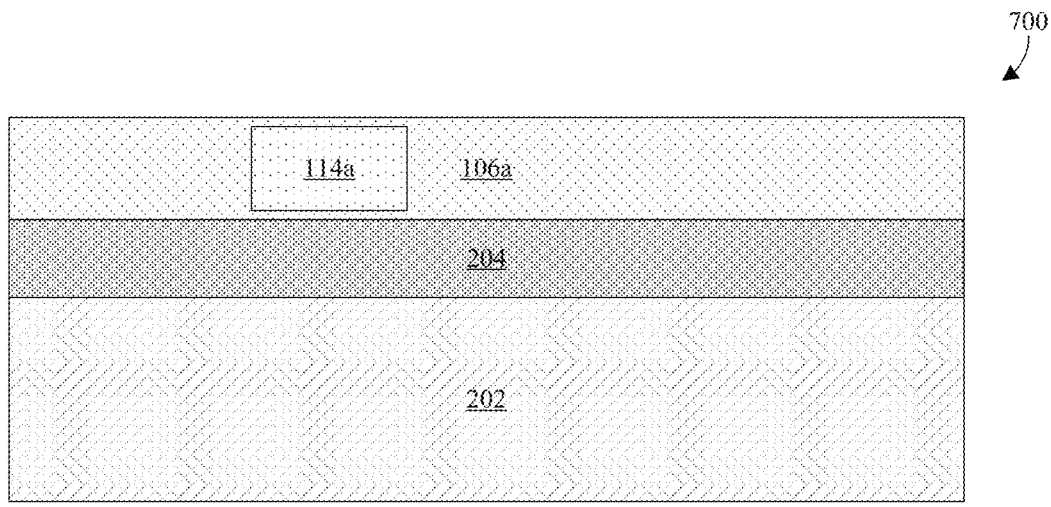

As illustrated by the cross-sectional view 700 of FIG. 7, a photodetector 114a is formed buried in the silicon germanium layer 106a. In some embodiments, the photodetector 114a is formed confined to the silicon germanium layer 106a. The photodetector 114a is a doped region of n- or p-type dopants having an opposite doping type as the silicon germanium layer 106a. The photodetector 114a may, for example, be formed by ion implantation.

Figure 8:
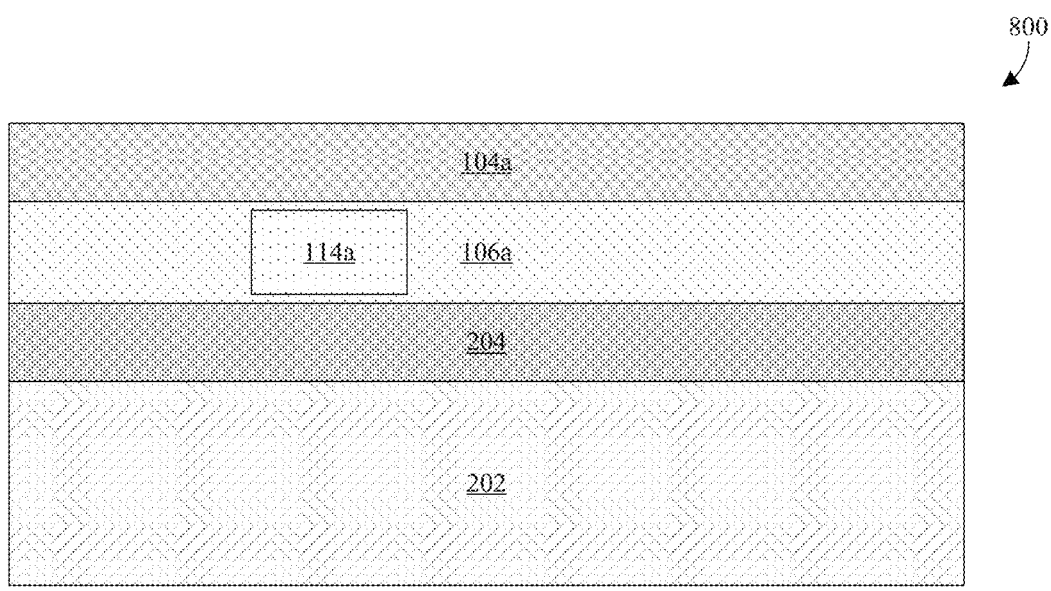

As illustrated by the cross-sectional view 800 of FIG. 8, an upper silicon layer 104a is formed over the silicon germanium layer 106a and the photodetector 114a by epitaxy. In some embodiments, the upper silicon layer 104a is formed of elemental or pure silicon, and/or is formed directly on the silicon germanium layer 106a.

Figure 9:
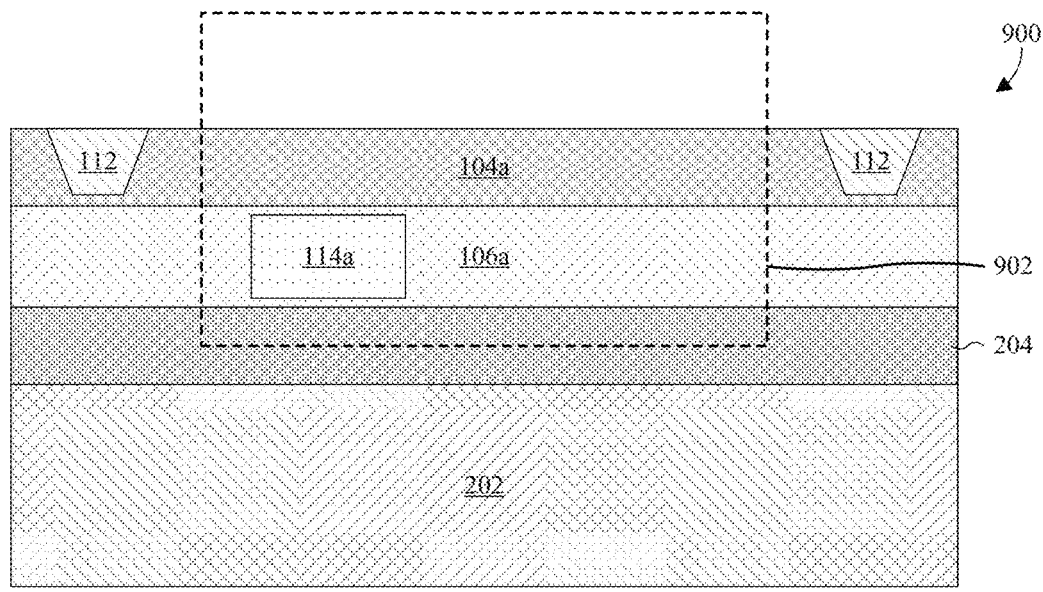

As illustrated by the cross-sectional view 900 of FIG. 9, an isolation region 112 is formed in the upper silicon layer 104a, laterally surrounding a pixel sensor region 902. The isolation region 112 may, for example, be formed as an STI region or an implant isolation region. In some embodiments, the process for forming the isolation region 112 comprises etching the upper silicon layer 104a to form a trench laterally surrounding the pixel sensor region 902, and subsequently filling the trench with a dielectric material, such as silicon dioxide.

Figure 10:
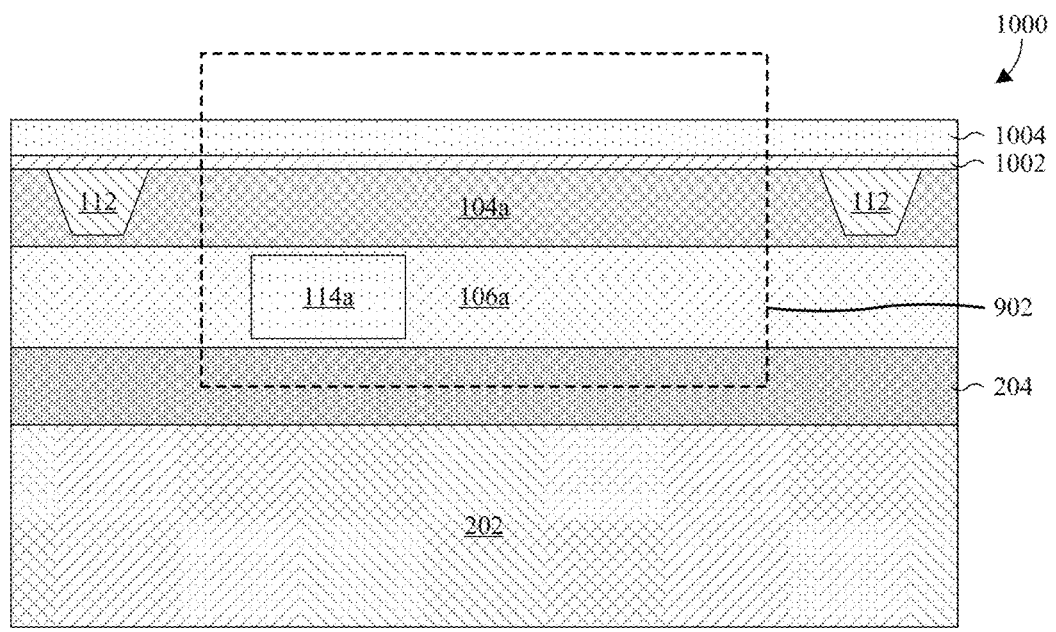

As illustrated by the cross-sectional view 1000 of FIG. 10, a dielectric layer 1002 and a conductive layer 1004 are formed stacked over the upper silicon layer 104a and the isolation region 112. The dielectric layer 1002 is formed on the upper silicon layer 104a, and the conductive layer 1004 is formed on the dielectric layer 1002. In some embodiments, the dielectric layer 1002 is formed directly on the upper silicon layer 104a, and/or the conductive layer 1004 is formed directly on the dielectric layer 1002. The conductive layer 1004 and the dielectric layer 1002 may be formed by, for example, vapor deposition, such as chemical vapor deposition (CVD) and physical vapor deposition (PVD), atomic layer deposition (ALD), and/or thermal oxidation. The dielectric layer 1002 may be, for example, an oxide or a high κ dielectric. The conductive 1004 layer may be, for example, metal or doped polysilicon.

Figure 11:
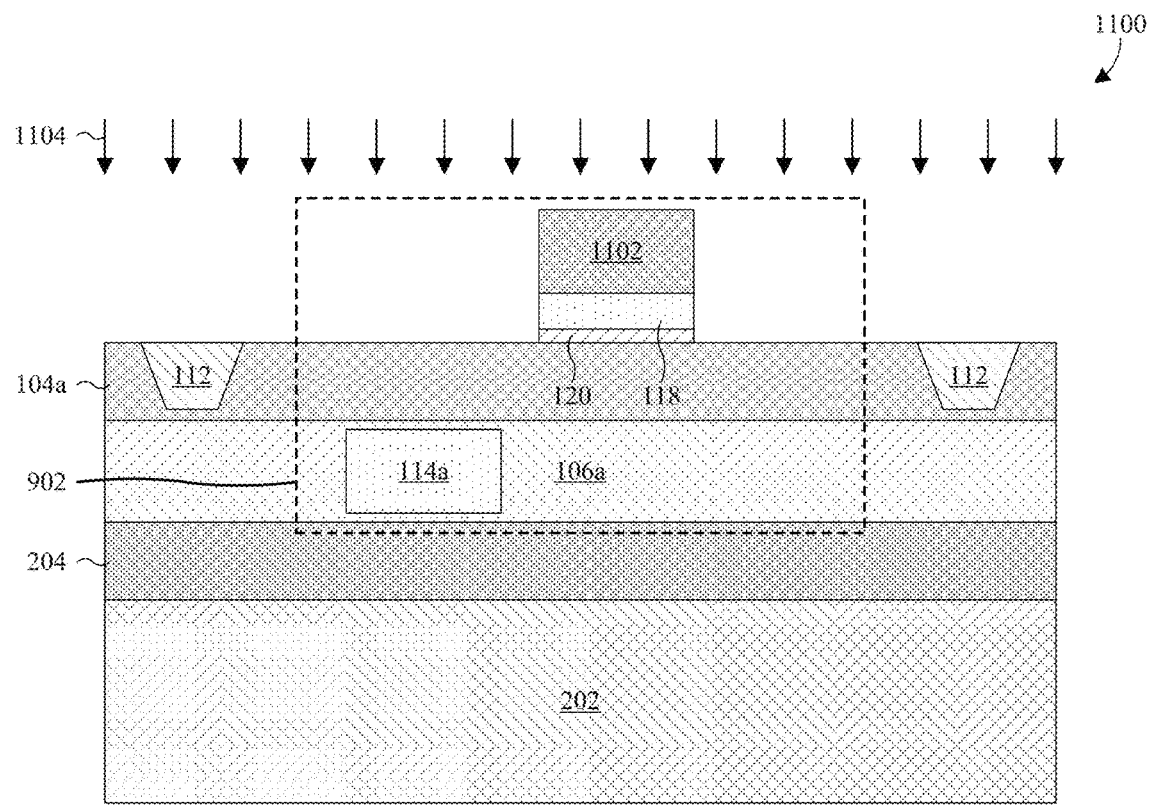

As illustrated by the cross-sectional view 1100 of FIG. 11, an etch is performed into the dielectric layer 1002 (see FIG. 10) and the conductive layer 1004 (see FIG. 10). The etch forms a transfer gate 118 and a transfer gate dielectric layer 120 insulating the transfer gate 118 form the upper silicon layer 104a. In some embodiments, the process for performing the etch comprises depositing and patterning a photoresist layer 1102 over the conductive layer 1004. For example, the photoresist layer 1102 may be patterned to mask regions of the conductive layer 1004 corresponding to the transfer gate 118. Thereafter, one or more etchants 1104, such as wet or dry etchants, are applied to the conductive layer 1004 and the dielectric layer 1002 while using the photoresist layer 1102 as a mask. After performing the etch, the photoresist layer 1102 is removed or otherwise stripped.

Figure 12:
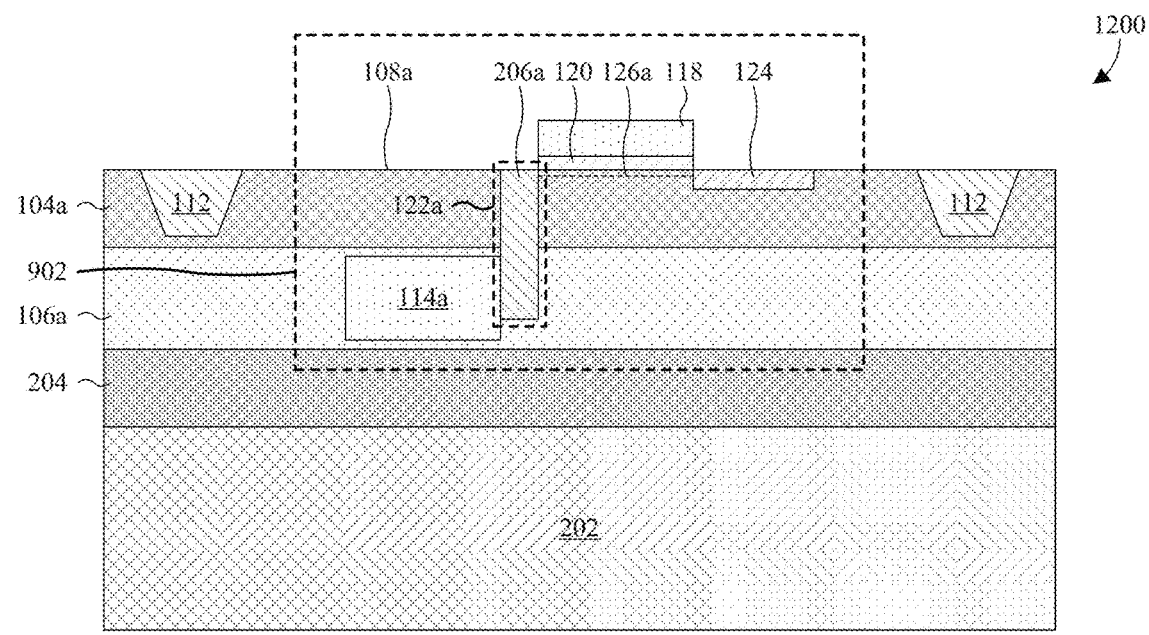

As illustrated by the cross-sectional view 1200 of FIG. 12, source/drain regions 122a, 124 are formed on opposing sides of the transfer gate 118 to define a selectively-conductive channel region 126a under the transfer gate 118. Further, one of the source/drain regions 122a, 124 is formed with a conductive channel region 206a extending to the photodetector 114 from about even with an upper surface 108a of the upper silicon layer 104a. The source/drain regions 122a, 124 and the conductive channel region 206a may, for example, be doped regions of an opposite doping type as the upper silicon layer 104a and/or the silicon germanium layer 106a. In some embodiments, the source/drain regions 122a, 124 and the conductive channel region 206a are formed by ion implantation of dopants into the upper silicon layer 104a and the silicon germanium layer 106a. Further, in some embodiments, the dopants are implanted with a gradient, such that the concentration of dopants in the upper silicon layer 104a is higher than in the silicon germanium layer 106a.

In some alternative embodiments, the conductive channel region 206a is formed before forming the dielectric layer 1002 and the conductive layer 1004 in FIG. 10, and the transfer gate 118 is formed over the conductive channel region 206a. See, for example, FIGS. 2K and 2L. Further, in some alternative embodiments, source/drain regions having substantially horizontal profiles are formed on opposing sides of the transfer gate 118 and a conductive channel region is formed extending from one of the source/drain regions to the photodetector 114. See, for example, FIGS. 2C-F.

Figure 13:
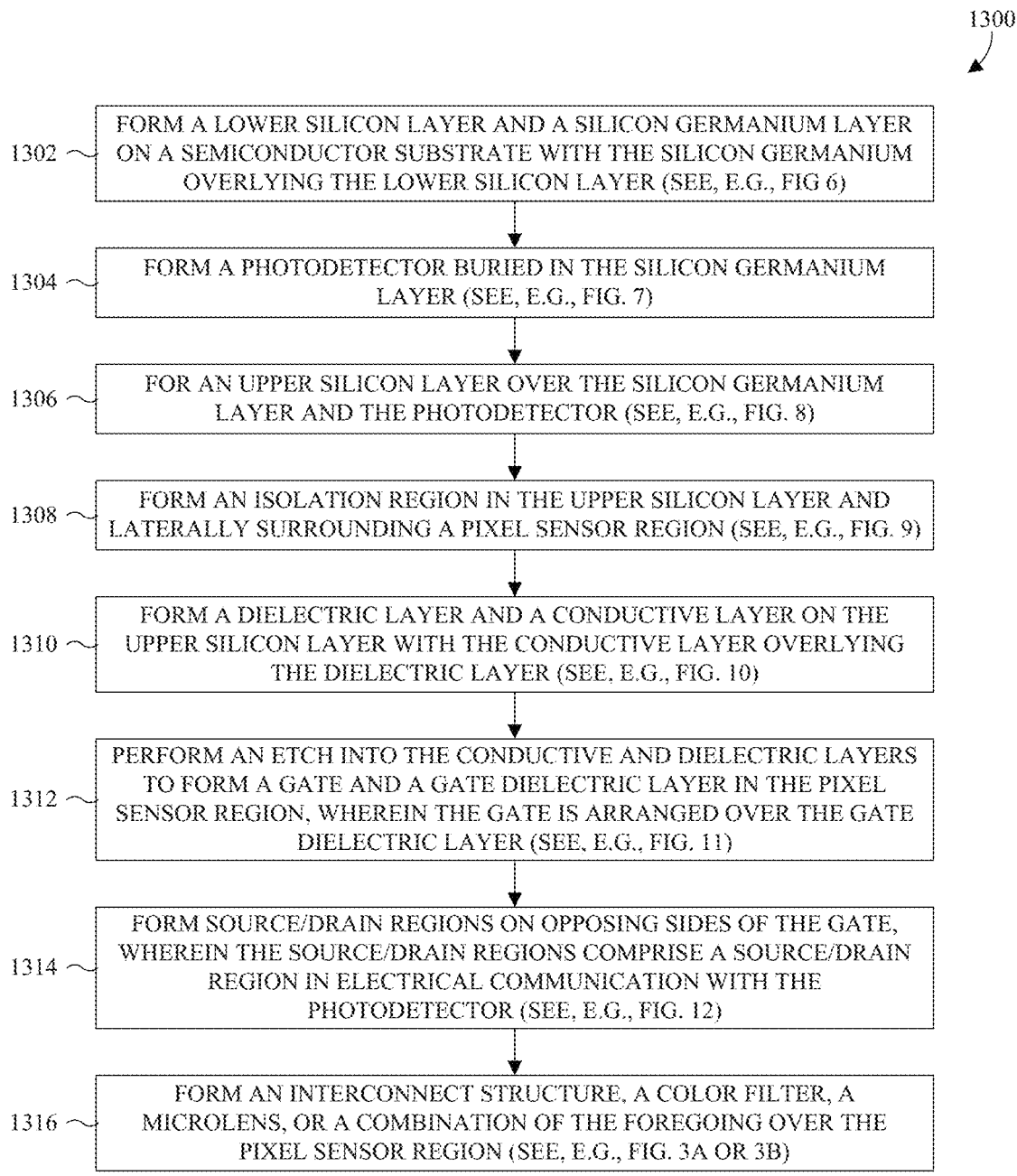
FIG. 13 illustrates a flowchart of some embodiments of a method for manufacturing a CMOS image sensor with silicon and silicon germanium.

With reference to FIG. 13, a flowchart 1300 of some embodiments of a method for manufacturing a CMOS image sensor with silicon and silicon germanium is provided. The method may, for example, correspond to the series of cross-sectional views of FIGS. 6-12.

At 1302, a lower silicon layer and a silicon germanium layer are formed on a semiconductor substrate with the silicon germanium overlying the lower silicon layer. See, for example, FIG. 6.

At 1304, a photodetector is formed buried in the silicon germanium layer. See, for example, FIG. 7. By forming the photodetector in the silicon germanium layer, the photodetector is advantageously more sensitive to infrared radiation.

At 1306, an upper silicon layer is formed over the silicon germanium layer and the photodetector. See, e.g., FIG. 8.

At 1308, an isolation region is formed in the upper silicon layer and laterally surrounding a pixel sensor region. See, for example, FIG. 9.

At 1310, a dielectric layer and a conductive layer are formed on the upper silicon layer with the conductive layer overlying the dielectric layer. See, for example, FIG. 10.

At 1312, an etch is performed into the conductive and dielectric layers to form a gate and a gate dielectric layer in the pixel sensor region, wherein the gate is arranged over the gate dielectric layer. See, for example, FIG. 11.

At 1314, source/drain regions are formed on opposing sides of the gate, wherein the source/drain regions comprise a source/drain region in electrical communication with the photodetector. See, for example, FIG. 12.

At 1316, an interconnect structure, a color filter, a microlens, or a combination of the foregoing are formed over the pixel sensor region. See, for example, FIG. 3A or 3B.

In some embodiments, a conductive channel region is formed between Acts 1308 and 1310, or is formed with Act 1314.

While the method described by the flowchart 1300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 14-21, a series of cross-sectional views of other embodiments of a method for manufacturing a CMOS image sensor with silicon and silicon germanium is provided. The cross-sectional views may, for example, correspond to the CMOS image sensor of FIG. 2G at various stages of manufacture.

Figure 14:
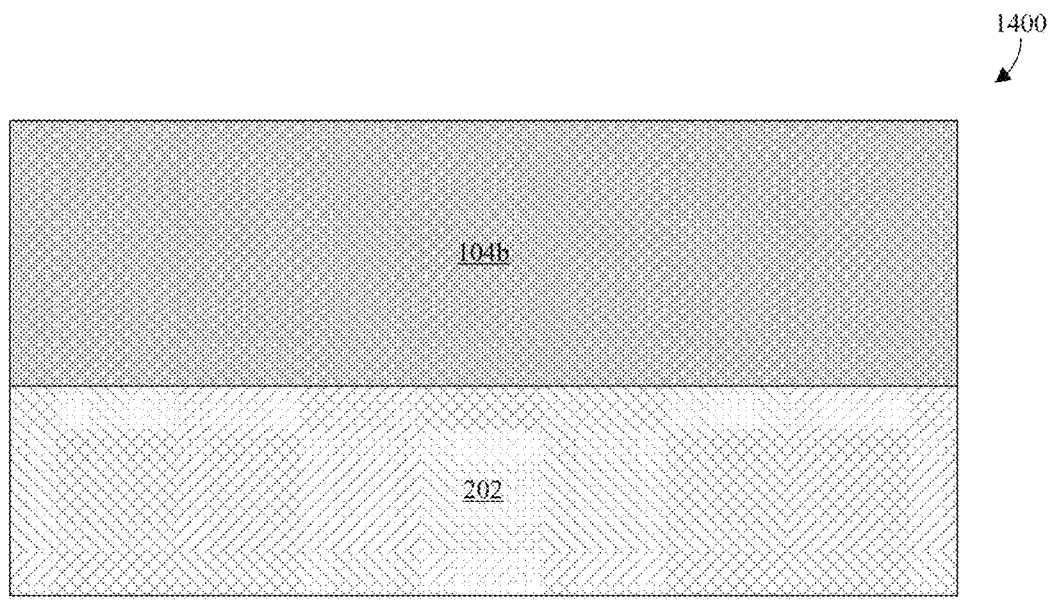
FIGS. 14-21 illustrate a series of cross-sectional views of other embodiments of a method for manufacturing a CMOS image sensor with silicon and silicon germanium.

As illustrated by the cross-sectional view 1400 of FIG. 14, a silicon layer 104b is formed over a semiconductor substrate 202. In some embodiments, the silicon layer 104 is formed of elemental or pure silicon, and/or is formed directly on the semiconductor substrate 202. The semiconductor substrate 202 may be, for example, a bulk semiconductor substrate or a SOI substrate, and/or may be, for example, doped.

Figure 15:
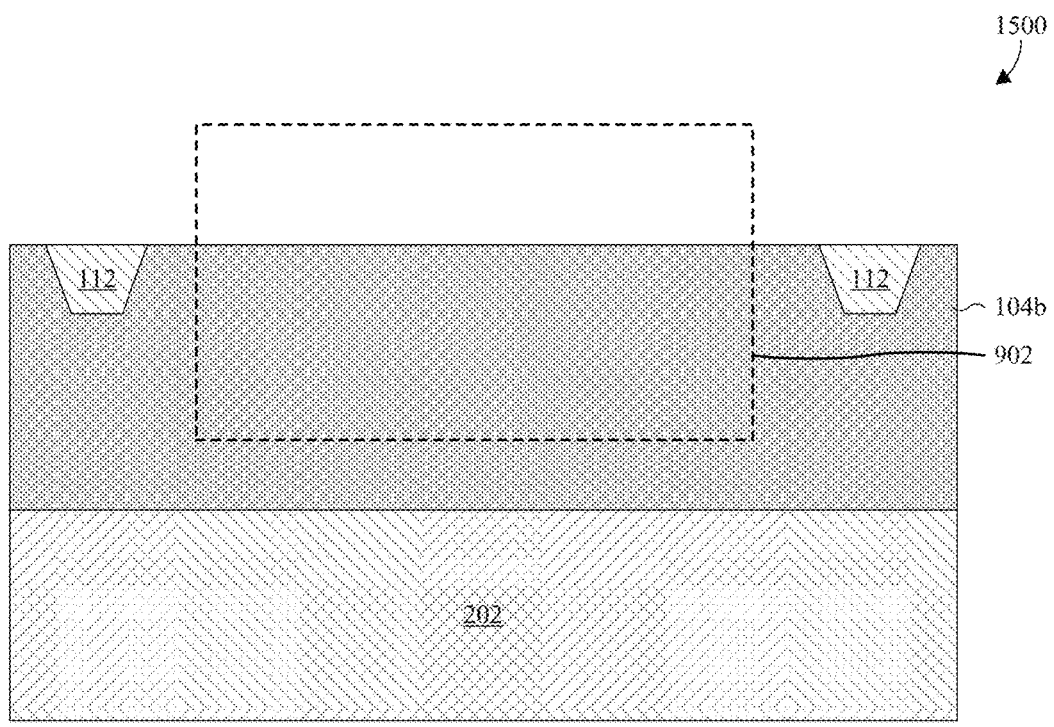

As illustrated by the cross-sectional view 1500 of FIG. 15, an isolation region 112 is formed in the silicon layer 104b, laterally surrounding a pixel sensor region 902. The isolation region 112 may, for example, be formed as an STI region or an implant isolation region. In some embodiments, the process for forming the isolation region 112 comprises etching the silicon layer 104b to form a trench laterally surrounding the pixel sensor region 902, and subsequently filling the trench with a dielectric material, such as silicon dioxide.

Figure 16:
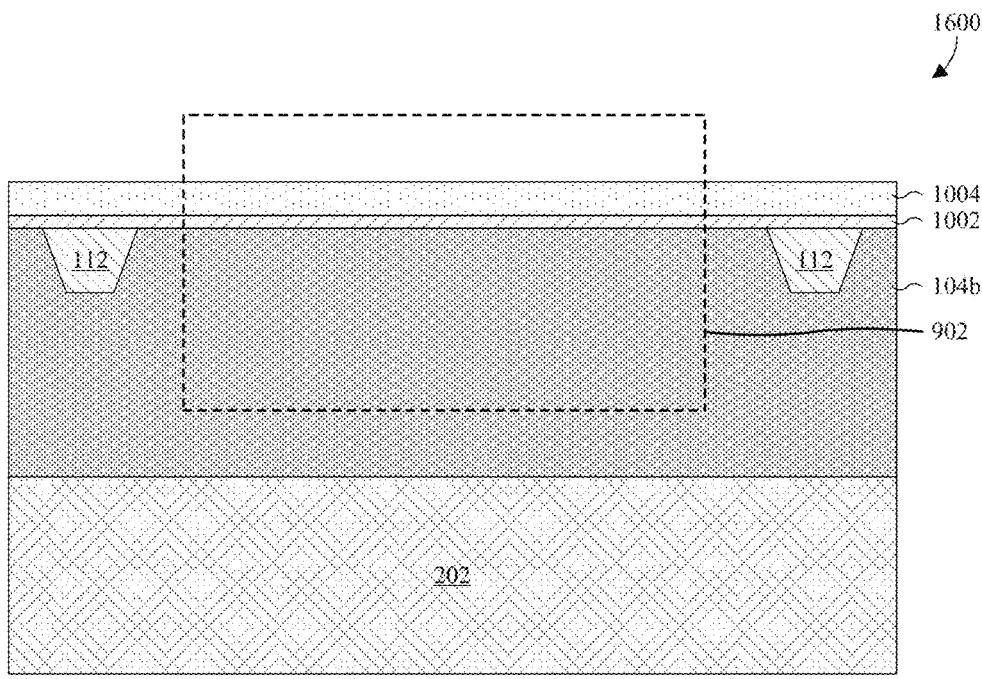

As illustrated by the cross-sectional view 1600 of FIG. 16, a dielectric layer 1002 and a conductive layer 1004 are formed stacked over the silicon layer 104b and the isolation region 112. The dielectric layer 1002 is formed on the silicon layer 104b, and the conductive layer 1004 is formed on the dielectric layer 1002. In some embodiments, the dielectric layer 1002 is formed directly on the silicon layer 104b, and/or the conductive layer 1004 is formed directly on the dielectric layer 1002. The conductive layer 1004 and the dielectric layer 1002 may be formed by, for example, vapor deposition, ALD, and/or thermal oxidation.

Figure 17:
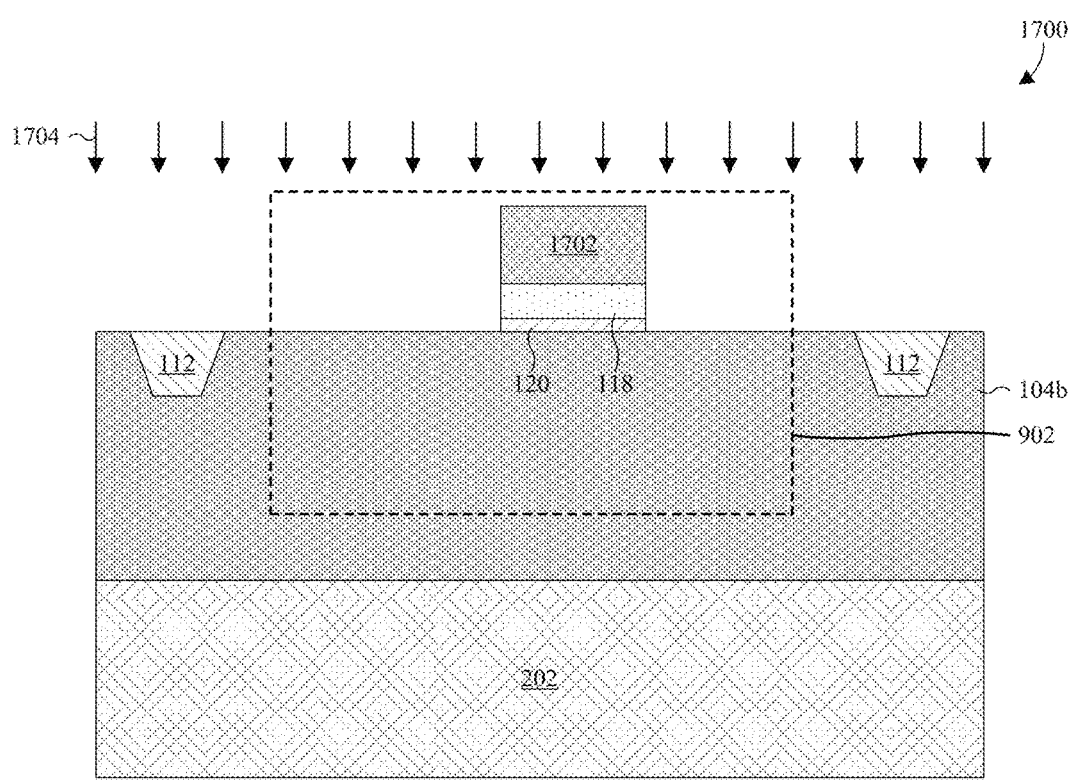

As illustrated by the cross-sectional view 1700 of FIG. 17, a first etch is performed into the dielectric layer 1002 (see FIG. 16) and the conductive layer 1004 (see FIG. 16). The first etch forms a transfer gate 118 and a transfer gate dielectric layer 120 insulating the transfer gate 118 form the silicon layer 104b. In some embodiments, the process for performing the first etch comprises depositing and patterning a first photoresist layer 1702 over the conductive layer 1004. For example, the first photoresist layer 1702 may be patterned to mask regions of the conductive layer 1004 corresponding to the transfer gate 118. Thereafter, one or more etchants 1704, such as wet or dry etchants, are applied to the conductive layer 1004 and the dielectric layer 1002 while using the first photoresist layer 1702 as a mask. After performing the first etch, the first photoresist layer 1702 is removed or otherwise stripped.

Figure 18:
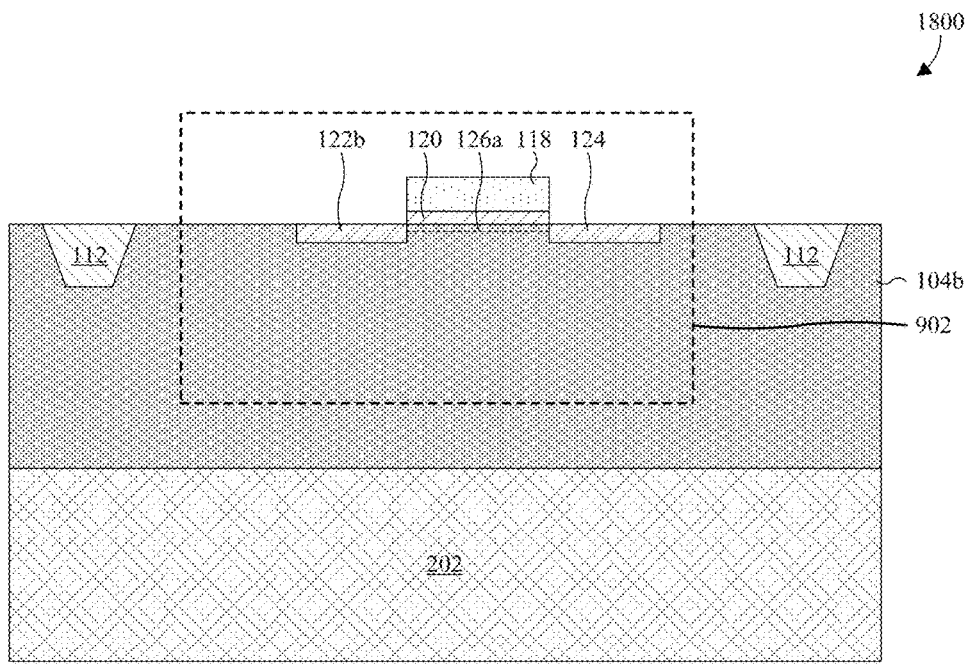

As illustrated by the cross-sectional view 1800 of FIG. 18, source/drain regions 122*b*, 124 are formed on opposing sides of the transfer gate 118 to define a selectively-conductive channel region 126*a* under the transfer gate 118. The source/drain regions 122*b*, 124 may, for example, be doped regions of an opposite doping type as the silicon layer 104*b*. Further, one of the source/drain regions 122*b*, 124 may be or otherwise comprise a conductive channel region with a substantially vertical profile. In some embodiments, the source/drain regions 122*b*, 124 are formed by ion implantation of dopants into the silicon layer 104*b*.

Figure 19:
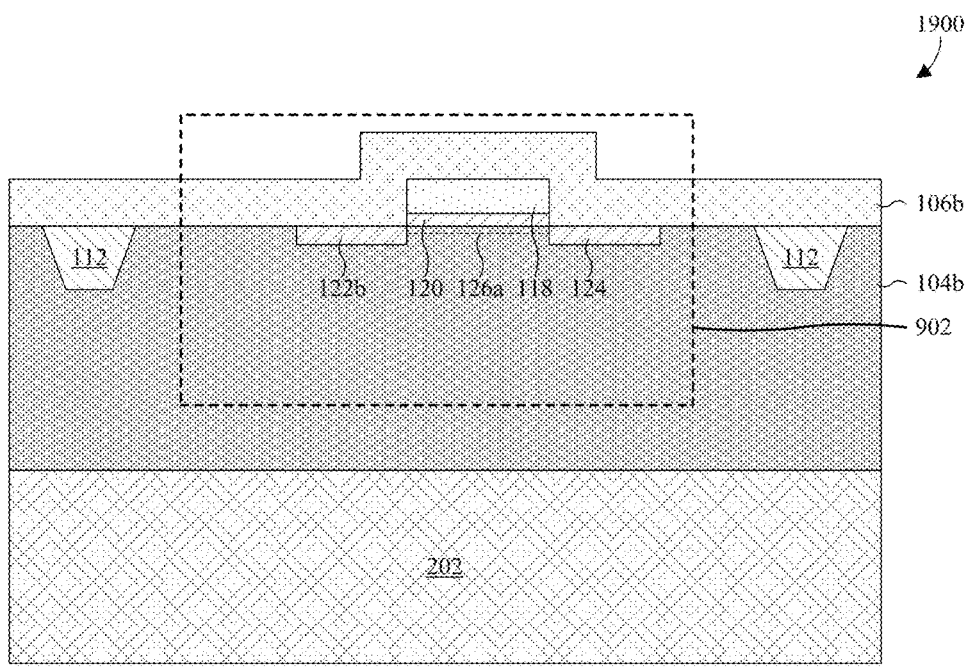

As illustrated by the cross-sectional view 1900 of FIG. 19, a silicon germanium layer 106*b* is formed by epitaxy. The silicon germanium layer 106*b* is formed on the silicon layer 104*b*, lining the transfer gate 118. In some embodiments, the silicon germanium layer 106*b* is formed of $SiGe_{1-x}$, and/or is formed directly on the silicon layer 104*b*.

Figure 20:
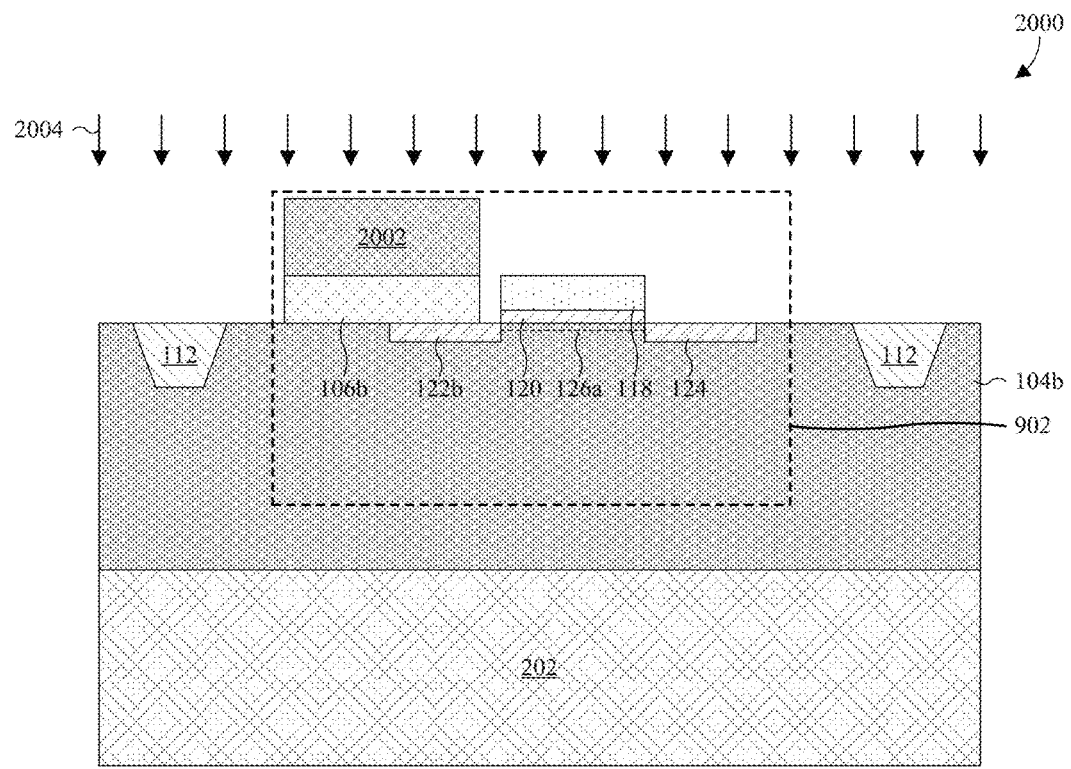
Figure 21:
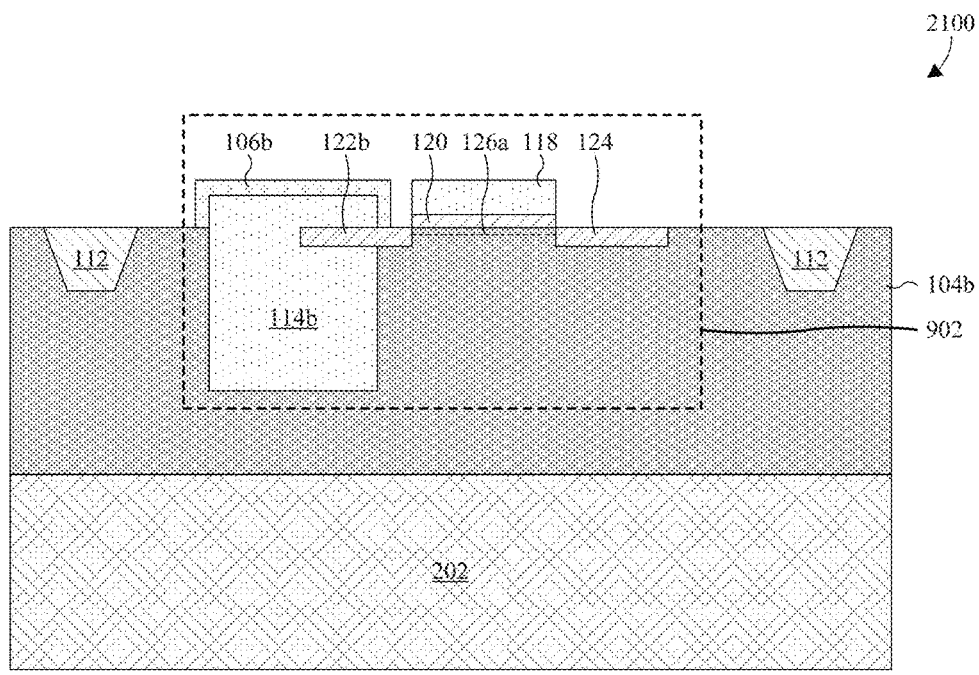

As illustrated by the cross-sectional view 2000 of FIG. 20, a second etch is performed into the silicon germanium layer 106*b* to restrict the silicon germanium layer 106*b* to a location between the isolation region 112 and one of the source/drain regions 122*b*, 124. In some embodiments, the process for performing the second etch comprises depositing and patterning a second photoresist layer 2002 over the silicon germanium layer 106*b*. Thereafter, one or more etchants 2004, such as wet or dry etchants, are applied to the silicon germanium layer 106*b* while using the second photoresist layer 2002 as a mask. After performing the second etch, the second photoresist layer 2002 is removed or otherwise stripped.

As an alternative to forming and subsequently etching the silicon germanium layer 106*b* over the silicon layer 104*b* in FIGS. 19 and 20, the second etch may be performed into the silicon layer 104*b* and the silicon germanium layer 106*b* may be formed filling a resulting opening of the second etch. Further, the silicon germanium layer 106*b* may be etched back, such that it's confined to the resulting opening. See, for example, FIGS. 2I and 2J.

As illustrated by the cross-sectional view 2100 of FIG. 2I, a photodetector 114*b* is formed buried in the silicon germanium layer 106*b*. In some embodiments, the photodetector 114*b* is formed confined to the silicon germanium layer 106*b*. The photodetector 114*b* is a doped region of n- or p-type dopants having an opposite doping type as the silicon germanium layer 106*b*. The photodetector 114*b* may, for example, be formed by ion implantation.

Figure 22:
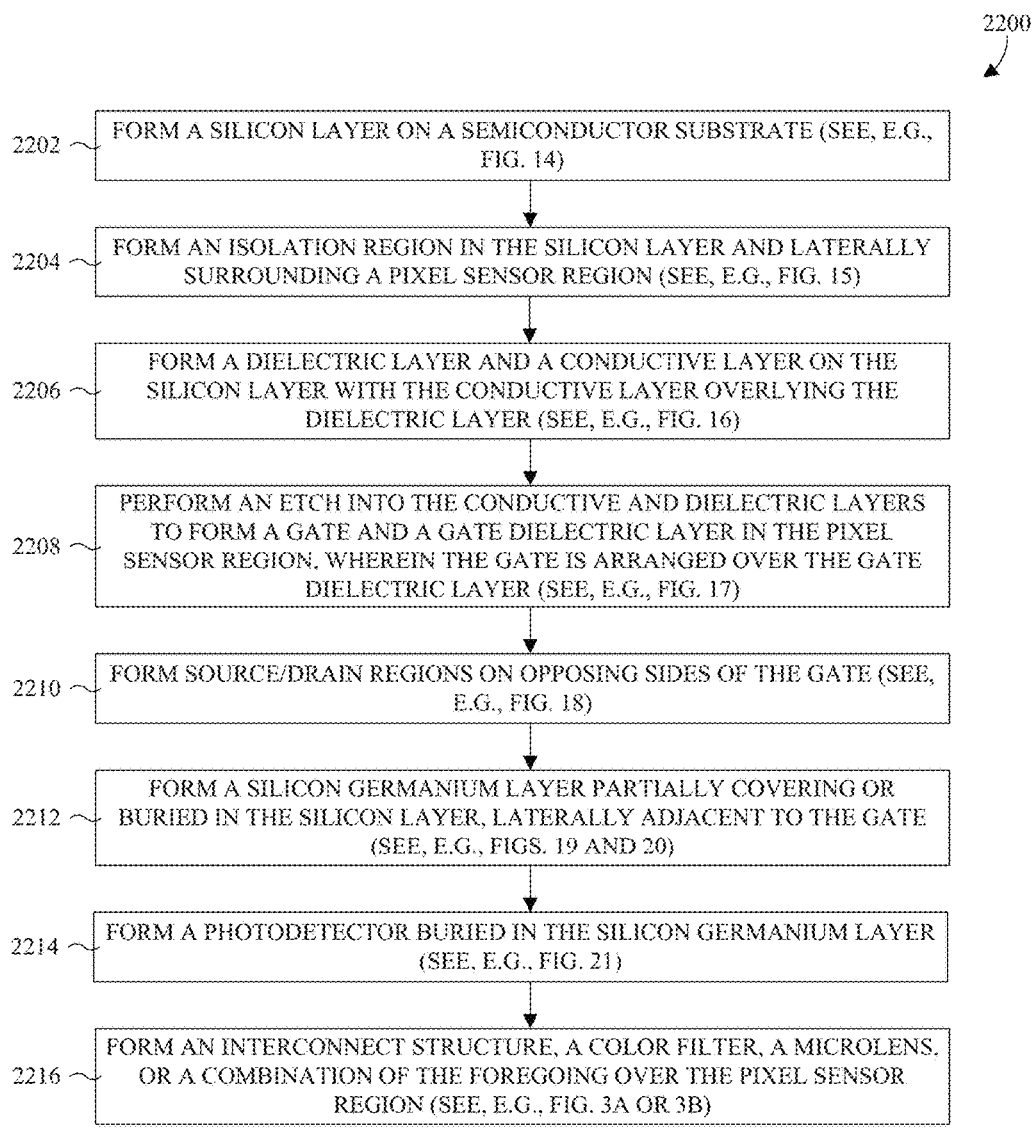
FIG. 22 illustrates a flowchart of other embodiments of a method for manufacturing a CMOS image sensor with silicon and silicon germanium.

With reference to FIG. 22, a flowchart 2200 of other embodiments of a method for manufacturing a CMOS image sensor with silicon and silicon germanium is provided. The method may, for example, correspond to the series of cross-sectional views of FIGS. 14-21.

At 2202, a silicon layer is formed on a semiconductor substrate. See, for example, FIG. 14.

At 2204, an isolation region is formed in the silicon layer, laterally surrounding a pixel sensor region. See, for example, FIG. 15.

At 2206, a dielectric layer and a conductive layer are formed on the silicon layer with the conductive layer overlying the dielectric layer. See, for example, FIG. 16.

At 2208, an etch is performed into the conductive and dielectric layers to form a gate and a gate dielectric layer in the pixel sensor region with the gate arranged over the gate dielectric layer. See, for example, FIG. 17.

At 2210, source/drain regions are formed on opposing sides of the gate. See, for example, FIG. 18.

At 2212, a silicon germanium layer is formed partially covering or buried in the silicon layer, laterally adjacent to the gate. See, for example, FIGS. 19 and 20.

At 2214, a photodetector is formed buried in the silicon germanium layer. See, for example, FIG. 2I.

At 2216, an interconnect structure, a color filter, a microlens, or a combination of the foregoing are formed over the pixel sensor region. See, for example, FIG. 3A or 3B.

While the method described by the flowchart 2200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, in some embodiments, the present disclosure provides a CMOS image sensor. A silicon germanium layer abuts a silicon layer. A photodetector is arranged in the silicon germanium layer. A transistor is arranged on the silicon layer with a source/drain region that is buried in a surface of the silicon layer and that is electrically coupled to the photodetector.

In other embodiments, the present disclosure provides a method for manufacturing a CMOS image sensor. A semiconductor stack is formed with a silicon layer and a silicon germanium layer. A photodetector is formed in the silicon germanium layer. A transistor is formed on the silicon layer with a source/drain region that is buried in a surface of the silicon layer and that is electrically coupled to the photodetector.

In yet other embodiments, the present disclosure provides an image sensor. A semiconductor stack is arranged over a semiconductor substrate. The semiconductor stack comprises a lower silicon layer, a silicon germanium layer overlying the lower silicon layer, and an upper silicon layer overlying the silicon germanium layer. An array of pixel sensors is arranged in the semiconductor stack. The pixel sensors comprise a photodetector buried in the silicon germanium layer and a transistor arranged on the upper silicon layer. The transistor comprises a gate and a pair of source/drain regions arranged in the upper silicon layer on opposing sides of the gate. The source/drain region regions comprise a source/drain region electrically coupled to the photodetector. An isolation region is arranged between the pixel sensors and laterally surrounds the pixel sensors. A logic region laterally surrounds the isolation region and comprises a logic transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A complementary metal-oxide-semiconductor (CMOS) image sensor comprising:
   a silicon layer abutting a silicon germanium layer;
   a first continuous semiconductor region with a single doping type, wherein the first continuous semiconductor region is in the silicon layer;
   a photodetector arranged in the silicon germanium layer, wherein a top surface of the photodetector is within the silicon germanium layer, and wherein the photodetector is a second continuous semiconductor region with a single doping type; and
   a transistor arranged on the silicon layer with a source/drain region that is buried in a surface of the silicon layer and is electrically coupled to the photodetector;
   wherein the source/drain region and the photodetector directly contact the first continuous semiconductor region at respective PN junctions, and wherein the transistor and the photodetector are laterally between and laterally spaced from opposite sidewalls of the first continuous semiconductor region.

2. The CMOS image sensor according to claim 1, wherein the silicon layer is elemental or pure silicon.

3. The CMOS image sensor according to claim 1, further comprising:
   an additional silicon layer abutting the silicon germanium layer, wherein the silicon germanium layer is arranged between the silicon layer and the additional silicon layer, such that the silicon layer and the additional silicon layer are respectively over and under the silicon germanium layer.

4. The CMOS image sensor according to claim 3, wherein a bottom surface of the photodetector is over a location at which the additional silicon layer and the silicon germanium layer directly contact.

5. The CMOS image sensor according to claim 1, wherein the source/drain region protrudes from substantially even with the surface of the silicon layer to a location neighboring the photodetector.

6. The CMOS image sensor according to claim 1, wherein the transistor further comprises a gate electrode, a gate dielectric layer, and an additional source/drain region, wherein the gate dielectric layer spaces the gate electrode over the surface of the silicon layer, wherein the additional source/drain region is buried in the surface of the silicon layer and is laterally spaced from the source/drain region to define a selectively-conductive channel region, and wherein the selectively-conductive channel region is directly under the gate electrode.

7. The CMOS image sensor according to claim 1, wherein a topmost point of the photodetector is below an interface between the silicon layer and the silicon germanium layer, and wherein the transistor comprises a gate electrode over the interface.

8. The CMOS image sensor according to claim 1, wherein the source/drain region extends from the surface of the silicon layer to a location that is laterally adjacent to the photodetector and that is in the silicon germanium layer, and wherein the source/drain region adjoins a sidewall of the photodetector.

9. The CMOS image sensor according to claim 8, wherein the transistor comprises a gate electrode, and wherein the location is laterally between the gate electrode and the photodetector.

10. The CMOS image sensor according to claim 8, wherein the source/drain region has a doping gradient in which doping concentration is higher in the silicon layer than in the silicon germanium layer.

11. The CMOS image sensor according to claim 1, wherein the silicon germanium layer is over and sunken into the silicon layer, and wherein a top surface of the silicon germanium layer is even with a top surface of the silicon layer.

12. The CMOS image sensor according to claim 1, wherein a bottom surface of the silicon germanium layer is below the surface of the silicon layer.

13. An image sensor comprising:
   a semiconductor stack arranged over a semiconductor substrate, the semiconductor stack comprising a lower silicon layer, a silicon germanium layer overlying the lower silicon layer, and an upper silicon layer overlying the silicon germanium layer;
   an array of pixel sensors arranged in the semiconductor stack, the pixel sensors comprising a photodetector buried in the silicon germanium layer and a transistor arranged on the upper silicon layer, wherein the transistor comprises a gate and a pair of source/drain regions arranged in the upper silicon layer on opposing sides of the gate, wherein the source/drain regions comprise a source/drain region electrically coupled to the photodetector, wherein the source/drain region extends from a top surface of the upper silicon layer to a location that is laterally adjacent to the photodetector and that is in the silicon germanium layer, and wherein the source/drain region adjoins a sidewall of the photodetector;
   an isolation region arranged between the pixel sensors and laterally surrounding the pixel sensors; and
   a logic region laterally surrounding the isolation region and comprising a logic transistor.

14. The image sensor according to claim 13, wherein the lower silicon layer is arranged over and contacts the semiconductor substrate, wherein the silicon germanium layer is arranged over and contacts the lower silicon layer, wherein the upper silicon layer is arranged over and contacts the lower silicon layer, and wherein the upper and lower silicon layers are elemental or pure silicon.

15. The image sensor according to claim 13, wherein a top surface of the photodetector is below an interface between the upper silicon layer and the silicon germanium layer.

16. The image sensor according to claim 13, wherein the logic transistor is in the upper silicon layer and spaced from the silicon germanium layer, and wherein the source/drain regions comprise another source/drain region spaced from the silicon germanium layer.

17. An image sensor comprising:
   a semiconductor stack comprising a first doping type, wherein the semiconductor stack comprises a lower silicon layer, a silicon germanium layer over and contacting the lower silicon layer, and an upper silicon layer over and contacting the silicon germanium layer, and wherein the upper and lower silicon layers are elemental or pure silicon;
   a photodetector in the silicon germanium layer, wherein the photodetector is a doped region of the silicon germanium layer having a second doping type that is opposite the first doping type, and wherein a top surface of the photodetector is below the upper silicon layer; and
   a transistor over the upper silicon layer, wherein the transistor comprises a gate electrode, a first source/drain region, and a second source/drain region, wherein the gate electrode is spaced over a top surface of the upper silicon layer, wherein the first and second source/drain regions are recessed below the top surface of the upper silicon layer and are doped regions of the upper silicon layer with the second doping type, and wherein the first source/drain region is electrically coupled to the photodetector.

18. The image sensor according to claim 17, wherein the first source/drain region extends from the top surface of the upper silicon layer to a location that is laterally adjacent to the photodetector and that is in the silicon germanium layer, and wherein the first source/drain region is laterally between the gate electrode and the photodetector.

19. The image sensor according to claim 18, wherein a doping concentration of the first source/drain region increases from the top surface of the upper silicon layer to the location.

20. The image sensor according to claim 18, wherein the first source/drain region has a vertically elongated profile.

* * * * *